United States Patent
Oh et al.

(10) Patent No.: US 12,468,218 B2
(45) Date of Patent: Nov. 11, 2025

(54) METHOD OF FABRICATING SEMICONDUCTOR DEVICE

(71) Applicant: SAMSUNG ELECTRONICS CO., LTD., Suwon-si (KR)

(72) Inventors: Heungsuk Oh, Bucheon-si (KR); Kyu-Bin Han, Incheon (KR); Sangwook Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 792 days.

(21) Appl. No.: 17/812,005

(22) Filed: Jul. 12, 2022

(65) Prior Publication Data

US 2023/0176469 A1 Jun. 8, 2023

(30) Foreign Application Priority Data

Dec. 8, 2021 (KR) .......................... 10-2021-0174627

(51) Int. Cl.
*G03F 1/36* (2012.01)
*H01L 21/027* (2006.01)
*H01L 21/768* (2006.01)

(52) U.S. Cl.
CPC .............. *G03F 1/36* (2013.01); *H01L 21/027* (2013.01); *H01L 21/768* (2013.01)

(58) Field of Classification Search
CPC .......... G03F 1/36; G03F 7/70441; G03F 1/84; G03F 1/70; H01L 21/027; H01L 21/768; H01L 21/76816; H01L 21/0274; H01L 21/308; H01L 21/31144; H01L 21/32139; H10D 30/024; H10D 30/797; H10D 62/822
See application file for complete search history.

(56) References Cited

U.S. PATENT DOCUMENTS

| | | | |
|---|---|---|---|
| 6,178,539 B1 | 1/2001 | Papadopoulou et al. | |
| 7,882,480 B2 | 2/2011 | Ye et al. | |
| 8,250,495 B2* | 8/2012 | Lippincott | G03F 1/36 |
| | | | 716/50 |
| 8,812,999 B2 | 8/2014 | Liu et al. | |
| 10,262,100 B2* | 4/2019 | Cecil | G03F 1/36 |
| 10,466,586 B2 | 11/2019 | Lai et al. | |
| 10,831,977 B1* | 11/2020 | Gheith | G03F 1/36 |
| 10,990,003 B2 | 4/2021 | Hsu et al. | |
| 11,092,899 B2* | 8/2021 | Huang | G06N 3/045 |

(Continued)

*Primary Examiner* — Nha T Nguyen
(74) *Attorney, Agent, or Firm* — Morgan, Lewis & Bockius LLP

(57) ABSTRACT

Provided is a method of fabricating a semiconductor device using a curvilinear OPC method. The method of fabricating the semiconductor device includes performing an optical proximity correction (OPC) step on a layout to generate a correction pattern, the correction pattern having a curvilinear shape, performing a mask rule check (MRC) step on the correction pattern to generate mask data, and forming a photoresist pattern on a substrate using a photomask, which is manufactured based on the mask data. The MRC step includes generating a width skeleton in the correction pattern, generating a width contour, which satisfies a specification of a mask rule for a linewidth, from the width skeleton, and adding the correction pattern and the width contour to generate an adjusting pattern.

20 Claims, 25 Drawing Sheets

(56) References Cited

U.S. PATENT DOCUMENTS

| | | | |
|---|---|---|---|
| 2006/0190224 A1* | 8/2006 | Allen | G06F 30/398 |
| | | | 703/2 |
| 2009/0300557 A1* | 12/2009 | Parikh | G03F 1/68 |
| | | | 716/136 |
| 2012/0005635 A1* | 1/2012 | Lee | G03F 1/36 |
| | | | 716/53 |
| 2012/0072874 A1* | 3/2012 | Chiang | G06F 30/39 |
| | | | 716/52 |
| 2013/0198700 A1* | 8/2013 | Sakajiri | G03F 1/36 |
| | | | 716/53 |
| 2017/0262571 A1* | 9/2017 | Cheng | G03F 1/36 |
| 2020/0387660 A1* | 12/2020 | Cecil | G06T 7/0006 |
| 2021/0255539 A1* | 8/2021 | Cecil | G06T 7/13 |
| 2023/0100578 A1* | 3/2023 | Cao | G03F 7/705 |
| | | | 716/53 |
| 2023/0185183 A1* | 6/2023 | Hu | G03F 7/70441 |
| | | | 430/5 |
| 2023/0408901 A1* | 12/2023 | Lippincott | G03F 1/36 |
| 2024/0241436 A1* | 7/2024 | Peng | G03F 1/70 |

\* cited by examiner

METHOD OF FABRICATING SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0174627, filed on Dec. 8, 2021, in the Korean Intellectual Property Office, the entire contents of which are herein incorporated by reference.

TECHNICAL FIELD

The present inventive concept relates to a method of fabricating a semiconductor device, and more particularly, to a method of fabricating a semiconductor device using a curvilinear OPC method.

DISCUSSION OF RELATED ART

Due to their small-sized, multifunctional, and/or low-cost characteristics, semiconductor devices are being esteemed as important elements in the electronics industry. The semiconductor devices may be classified into a memory device for storing data, a logic device for processing data, and a hybrid device including both of memory and logic elements. As the electronic industry advances, there is an increasing demand for semiconductor devices with enhanced characteristics such as, for example, high reliability, high performance, and/or multiple functions. To meet this demand, structural complexity and/or integration density of semiconductor devices are being increased.

SUMMARY

An embodiment of the present inventive concept provides a curvilinear OPC method with high accuracy.

An embodiment of the present inventive concept provides a method of checking a mask rule in a fast and efficient manner.

According to an embodiment of the present inventive concept, a method of fabricating a semiconductor device may include performing an optical proximity correction (OPC) step on a layout to generate a correction pattern, the correction pattern having a curvilinear shape, performing a mask rule check (MRC) step on the correction pattern to generate mask data, and forming a photoresist pattern on a substrate using a photomask, which is manufactured based on the mask data. The MRC step may include generating a width skeleton in the correction pattern, generating a width contour, which satisfies a specification of a mask rule for a linewidth, from the width skeleton, and adding the correction pattern and the width contour to generate an adjusting pattern.

According to an embodiment of the present inventive concept, a method of fabricating a semiconductor device may include performing an optical proximity correction (OPC) step on a layout to generate a first correction pattern and a second correction pattern, which are adjacent to each other, and each of which has a curvilinear shape, performing a mask rule check (MRC) step on the first and second correction patterns to generate mask data, and forming a photoresist pattern on a substrate using a photomask, which is manufactured based on the mask data. The MRC step may include generating a space skeleton between the first and second correction patterns, generating a space contour, which satisfies a specification of a mask rule for a space between the first and second correction patterns, from the space skeleton, and subtracting the space contour from the first and second correction patterns to generate a first clean-up pattern and a second clean-up pattern, respectively.

According to an embodiment of the present inventive concept, a method of fabricating a semiconductor device may include performing an optical proximity correction (OPC) step on a layout to generate a first correction pattern and a second correction pattern, which are adjacent to each other, and each of which has a curvilinear shape, performing a mask rule check (MRC) step on the first and second correction patterns to generate mask data, and forming a photoresist pattern on a substrate using a photomask, which is manufactured based on the mask data. The MRC step may include generating a first width contour and a second width contour according to a mask rule, in the first and second correction patterns, respectively, generating a space contour according to the mask rule, between the first and second correction patterns, and performing a Boolean operation on the first and second correction patterns based on the first and second width contours and the space contour to generate a first clean-up pattern and a second clean-up pattern, respectively.

BRIEF DESCRIPTION OF THE DRAWINGS

Embodiments of the present inventive concept will be more clearly understood from the following detailed description taken in conjunction with the accompanying drawings, in which.

Figure 1:
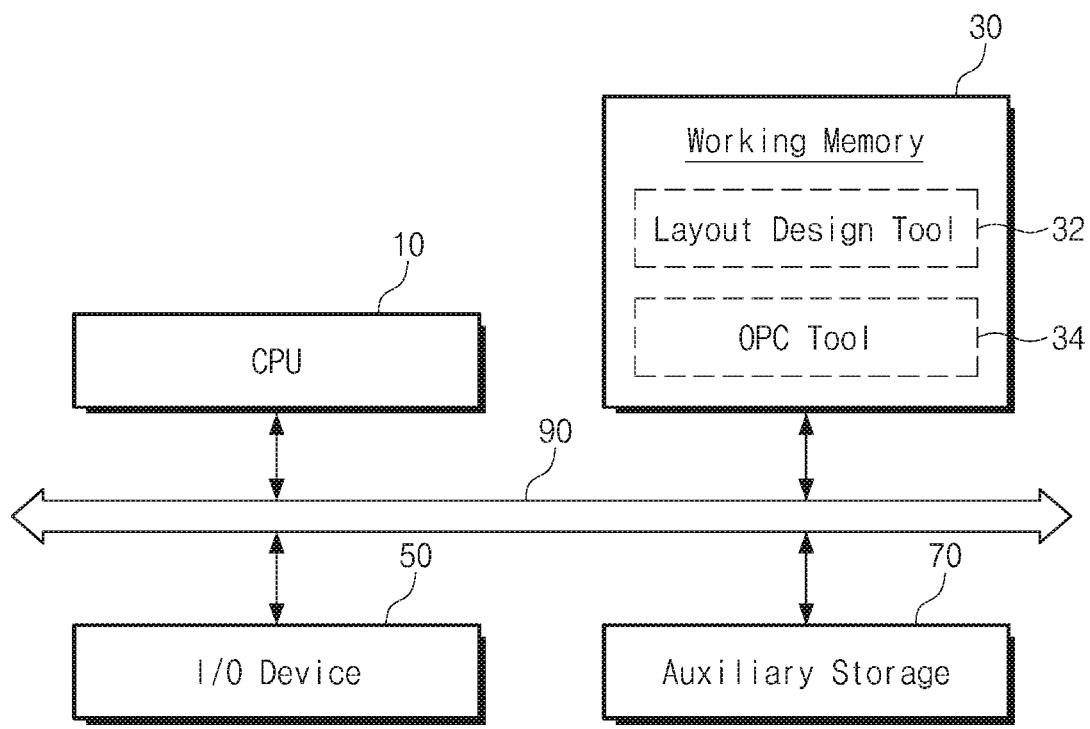
FIG. 1 is a block diagram illustrating a computer system for performing a semiconductor design process, according to an embodiment of the present inventive concept.

Since the drawings in FIGS. 1-19D are intended for illustrative purposes, the elements in the drawings are not necessarily drawn to scale. For example, some of the elements may be enlarged or exaggerated for clarity purpose.

DETAILED DESCRIPTION OF THE EMBODIMENTS

FIG. 1 is a block diagram illustrating a computer system for performing a semiconductor design process, according to an embodiment of the present inventive concept. Referring to FIG. 1, a computer system may include a central processing unit (CPU) 10, a working memory 30, an input-output unit 50, and an auxiliary storage 70. In an embodiment of the present inventive concept, the computer system may be a customized system for performing a layout design process according to an embodiment of the present inventive concept. Furthermore, the computer system may be configured to include various design and verification simulation programs.

The CPU 10 may be configured to run a variety of software programs, such as, for example, application programs, operating systems, and device drivers, which will be executed in the computer system. For example, the CPU 10 may be configured to run an operating system (OS) loaded on the working memory 30. Furthermore, the CPU 10 may be configured to run various application programs, which will be executed on the operating system (OS). For example, the CPU 10 may be configured to run a layout design tool 32 and/or an optical proximity correction (OPC) tool 34 loaded on the working memory 30.

The operating system or application programs may be loaded on the working memory 30. For example, when the computer system starts a booting operation, an image of the operating system stored in the auxiliary storage 70 may be loaded on the working memory 30 according to a booting sequence. Overall input/output operations of the computer system may be managed by the operating system (OS). An application program, which is chosen by a user or is provided for basic services, may be loaded on the working memory 30. For example, the layout design tool 32 and/or the OPC tool 34 may be loaded on the working memory 30 from the auxiliary storage 70. The working memory 30 may be used for storing temporary variables or other intermediate information during execution of instructions to be executed by the CPU 10.

The layout design tool 32 may provide a biasing function capable of changing specific layout patterns to have shapes and positions that are different from those defined by a design rule. The layout design tool 32 may be configured to perform a design rule check (DRC) under the changed condition for the bias data. The OPC tool 34 may be configured to perform an optical proximity correction (OPC) process on layout data, which is output from the layout design tool 32. Mask data may be output from the OPC tool 34, and the mask data obtained through the OPC process performed on the layout data may deviate significantly from the initial layout design and from the final photoresist pattern printed on a wafer using a photomask constructed with the mask data. The working memory 30 may be one of volatile memory devices (e.g., static random access memory (SRAM) or dynamic random access memory (DRAM) devices) or nonvolatile memory devices (e.g., phase-change RAM (PRAM), magnetic RAM (MRAM), resistive RAM (ReRAM), electrically erasable and programmable read-only memory (EEPROM), ferroelectric RAM (FRAM), and NOR FLASH memory devices).

The input-output unit 50 may be configured to control user's data to be input and output through a user interface device. For example, the input-output unit 50 may include a keyboard or a monitor which is used to receive relevant information from a designer. By using the input-output unit 50, it may be possible for the designer to receive information on semiconductor regions or data paths requiring adjusted operating characteristics. The input-output unit 50 may be configured to display a progressive status or result of a process that is executed by the OPC tool 34.

The auxiliary storage 70 may be provided as a storage medium of the computer system, and may be used to store the application programs, the image of the operating system, and various kinds of data. The auxiliary storage 70 may include one of memory cards (e.g., multimedia card (MMC), embedded multimedia card (eMMC), secure digital (SD) card, micro secure digital (MicroSD) card, and so forth), a hard disk drive (HDD), or a solid state drive (SSD). In an embodiment of the present inventive concept, the auxiliary storage 70 may include a NAND-type Flash memory device with a large memory capacity. In an embodiment of the present inventive concept, the auxiliary storage 70 may include next-generation nonvolatile memory devices (e.g., PRAM, MRAM, ReRAM, EEPROM, and FRAM devices) or a NOR FLASH memory device.

A system interconnector 90 may be a system bus provided for an internal network of the computer system. The CPU 10, the working memory 30, the input-output unit 50, and the auxiliary storage 70 may be electrically connected to each other through the system interconnector 90 to exchange data with each other. For example, the CPU 10 may be coupled with the system interconnector 90 for processing information. For example, the input-output unit 50 may be coupled to the system interconnector 90 for communicating information and command selections to the CPU 10. However, the structure of the system interconnector 90 may not be limited to this example, and in an embodiment of the present inventive concept, the system interconnector 90 may further include an interconnection element provided for efficient management.

Figure 2:
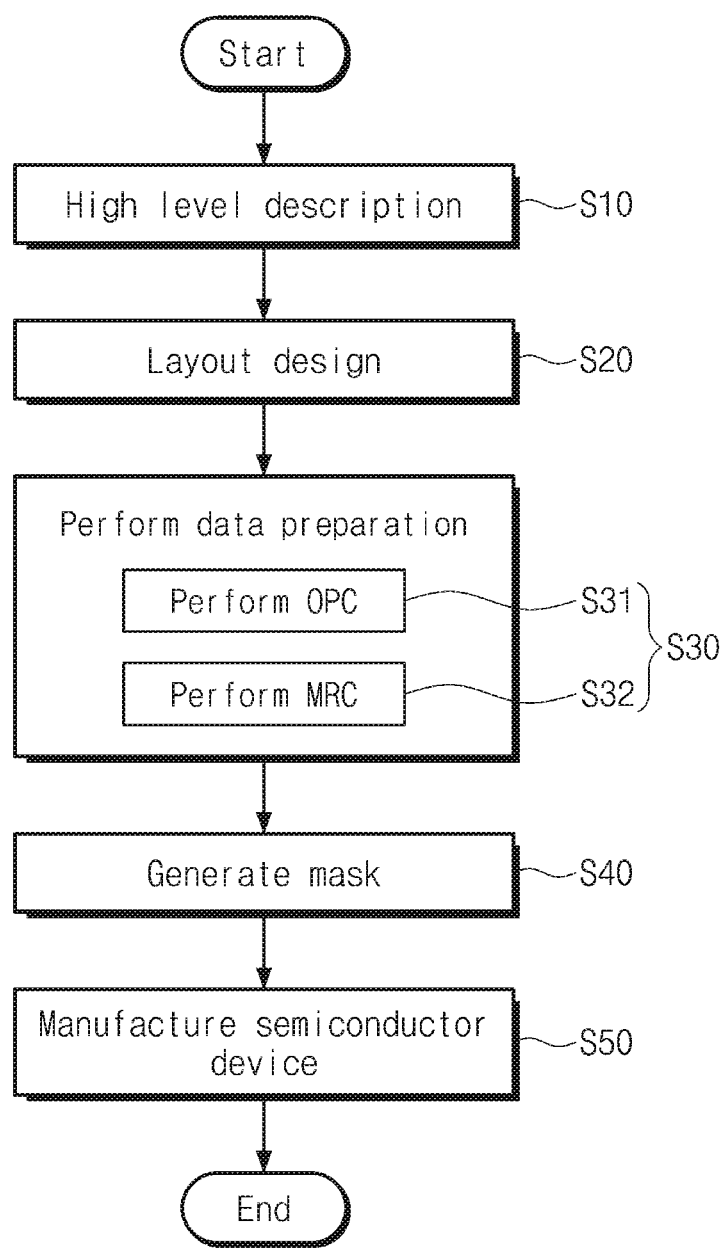
FIG. 2 is a flow chart illustrating a method of designing and fabricating a semiconductor device, according to an embodiment of the present inventive concept.

FIG. 2 is a flow chart illustrating a method of designing and fabricating a semiconductor device, according to an embodiment of the present inventive concept.

Referring to FIG. 2, a high-level design process of a semiconductor integrated circuit may be performed using the computer system described with reference to FIG. 1 (in S10). For example, in the high-level design process, an integrated circuit, which is a design target, may be described with high-level computer language. An example of the high-level computer language may be a C or C++ language. Circuits designed by the high-level design process may be more concretely described by a register-transfer-level (RTL) coding or a simulation. Furthermore, codes generated by the RTL coding may be converted into a netlist and may be combined to describe the entirety of the semiconductor device. For example, the netlist converted from the codes generated by the RTL may be converted to a physical layout subsequently. The combined schematic circuit may be verified by a simulation tool, and an adjusting step may be further performed based on a result of the verification step. The verification process is to ensure that the design meets the target specification.

A layout design step may be performed to realize the logically-completed semiconductor integrated circuit on a silicon (Si) wafer (in S20). For example, the layout design step may be performed, based on the schematic circuit prepared in the high-level design process or the netlist corresponding thereto. The layout design step may include a routing step of placing and connecting various standard cells that are provided from a cell library, based on a predetermined design rule.

The cell library for the layout design step may contain information on operation, speed, and power consumption of standard cells. A cell library for representing a layout of a circuit in a gate level may be defined in most of the layout design tools. Here, the layout may be prepared to define shapes, positions, or sizes of patterns constituting transistors and metal lines, which will be actually formed on a silicon (Si) wafer. For example, to actually form an inverter circuit on a silicon (Si) wafer, it may be necessary to appropriately place layout patterns (e.g., p-channel metal oxide semiconductor (PMOS), n-channel metal oxide semiconductor (NMOS), N-WELL, gate electrodes, and metal lines thereon). For this, at least one of inverters, which were previously defined in the cell library, may be searched and chosen.

Furthermore, a routing step may be performed on the chosen and placed standard cells. In detail, the routing step may be performed to connect the chosen and placed standard cells to upper-level lines. As a result of the routing step, the standard cells may be connected to each other in a designed manner. These steps may be automatically or manually performed in most of the layout design tools. In addition, a step of placing and routing the standard cells may be automatically performed using a Place & Routing tool. Through the placement and routing step, the netlist converted from the codes generated by the RTL may be converted to a physical layout.

After the routing step, a verification step may be performed on the layout to check whether there is a portion violating the given design rule. In an embodiment of the present inventive concept, the verification step may include evaluating verification items, such as, for example, a design rule check (DRC), an electrical rule check (ERC), and a layout vs schematic (LVS). The evaluation of DRC may be performed to evaluate whether the layout meets the given design rule. For example, DRC may verify whether the layout meets all technology-imposed constraints. The evaluation of ERC may be performed to evaluate whether there is an electrical disconnection issue in the layout. In addition, ERC can also check for structures susceptible to electrostatic discharge (ESD) damage. The evaluation of LVS may be performed to evaluate whether the layout is prepared to coincide with the gate-level netlist. For example, LVS may verify the functionality of the design.

A data preparation (DP) step may be performed to obtain mask data from a designed layout (in S30). The data preparation step may include performing an optical proximity correction (OPC) step on the designed layout (in S31) and performing a mask rule check (MRC) step on the result of the OPC step (in S32).

Layout patterns, which are prepared by the layout design step, may be realized on a silicon (Si) wafer through a photolithography process. The OPC step may be performed to correct an optical proximity or distortion effect, which may occur in the photolithography process. In the OPC step, the layout may be modified to reduce a difference in shape between designed patterns and actually-formed patterns, which may be caused by the refraction or process effects in an exposure step. As a result of the OPC step, the shapes and positions of patterns in the designed layout may be changed or biased. For example, in the OPC step, the original photomask pattern may be modified to compensate for effects that occur during the photolithography process, so as to enhance the quality of the actually printed pattern on wafer.

The MRC step (in S32) may be performed to check whether the patterns, which are changed through the OPC step, meet a mask rule. A pattern violating the mask rule may be adjusted to obtain a clean-up result, from which all errors on the mask rule are removed. The clean-up result may be as mask data obtained through the data preparation step S30. The data preparation step S30 according to an embodiment of the present inventive concept will be described in more detail with reference to FIGS. 4 to 11.

A photomask may be manufactured, based on the mask data obtained through the data preparation step (in S40). In general, the photomask may be manufactured by patterning a chromium layer provided on a glass substrate to depict the layout patterns. Patterning the chromium layer may include a lithographic process for mask making. Here, the lithographic process for mask making may be a concept that generally includes electron beam writing, development, etching, baking, and the like.

The manufactured photomask may be used to manufacture a semiconductor device (in S50). In the actual fabricating process, the exposing and etching steps may be repeatedly performed, and thus, patterns defined in the layout design step may be sequentially formed on a silicon substrate.

Figure 3:
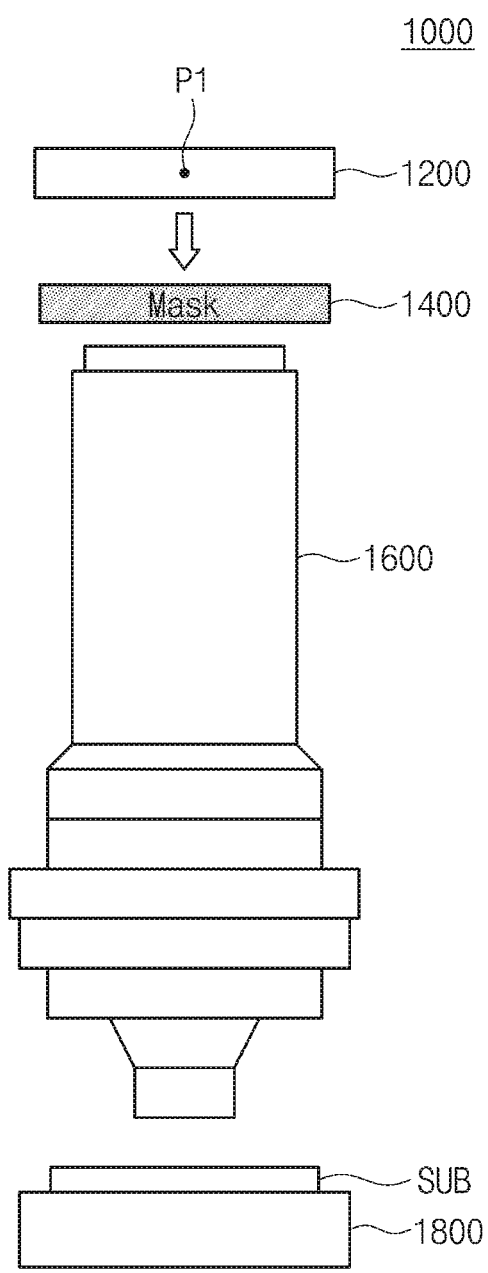
FIG. 3 is a conceptual diagram illustrating a photolithography system using a photomask according to an embodiment of the present inventive concept.

FIG. 3 is a conceptual diagram illustrating a photolithography system using a photomask according to an embodiment of the present inventive concept. A photolithography system 1000 may include a light source 1200, a photomask 1400, a reduction projection apparatus 1600, and a substrate stage 1800. Some elements may be additionally provided in the photolithography system 1000 shown in FIG. 3. For example, the photolithography system 1000 may further include a sensor, which is used to measure a height and a slope of a top surface of a substrate SUB.

The light source 1200 may be configured to emit light. The light emitted from the light source 1200 may be incident onto the photomask 1400. To control a focal length, a lens may be provided between the light source 1200 and the photomask 1400. The light source 1200 may be configured to emit an ultraviolet (UV) light. For example, the light source 1200 may be a krypton fluoride (KrF) light source (at 234 nm), an argon fluoride (ArF) light source (at 193 nm), or an extreme ultraviolet (EUV) light source (at 13.5 nm). The light source 1200 may include a single point light source P1, but the present inventive concept may not be limited to this example. In an embodiment of the present inventive concept, the light source 1200 may be configured to have a plurality of point light sources.

The photomask 1400 may include image patterns, which are used to transcribe or print the designed layout onto the substrate SUB. The image patterns may be formed, based on mask data obtained through the data preparation step described above. The image patterns may be defined by transparent and opaque regions. The transparent region may be formed by etching a metal layer (e.g., a chromium layer) that is provided on the photomask 1400. The transparent region may be transparent to light, which is emitted from the light source 1200. By contrast, the opaque region may be configured to prevent or block the light. In addition, to enhance image resolution in photolithography, the photomask 1400 may be an alternating phase shift mask or an attenuated phase shift mask. In the alternating phase-shift mask, certain transparent regions are made thinner or thicker, while in the attenuated phase-shift mask, certain opaque regions are modified to allow a small amount of light to be transmitted through (typically just a few percent).

The light passing through the transparent region of the photomask 1400 may be incident onto a photoresist layer, which is formed on the substrate SUB, through the reduction projection apparatus 1600, and as a result, photoresist patterns may be formed on the substrate SUB. That is, the light may be incident onto the substrate SUB through the reduction projection apparatus 1600, and in this case, the photoresist patterns, which are formed on the substrate SUB using the reduction projection apparatus 1600, may have shapes corresponding to the image patterns of the photomask 1400. In sum, by using the reduction projection apparatus 1600, it may be possible to form the photoresist patterns, whose shapes are defined by the image patterns of the photomask 1400, on the substrate SUB. There may be a 4× or 5× reduction between the image patterns of the photomask 1400 and the photoresist patterns produced in the photoresist on the substrate SUB.

The substrate stage 1800 may be configured to support the substrate SUB. The substrate SUB may include, for example, a silicon (Si) wafer. The reduction projection apparatus 1600 may include an aperture. The aperture may be used to increase a focal depth of the ultraviolet light emitted from the light source 1200. As an example, the aperture may include a dipole or quadruple aperture. The reduction projection apparatus 1600 may further include a lens for controlling a focal length. In an embodiment of the present inventive concept, the reduction projection apparatus 1600 may have a 4× reduction lens.

As an integration density of a semiconductor device increases, a distance between the image patterns of the photomask 1400 may have a very small value. In this case, due to a proximity issue, the patterns formed on the substrate SUB may have distorted shapes (i.e., different from those of the image patterns of the photomask 1400). The distortion of the patterns may lead to malfunction of an electronic device or circuit to be formed on the substrate SUB.

A resolution enhancement technology may be used to prevent the distortion of the patterns. An OPC technology, which is used in the step S31 of FIG. 2, may be an example of the resolution enhancement technology. Other resolution enhancement techniques such as, for example, off-axis illumination, phase-shift masking, and layout constraints besides the OPC technology may be used to enhance the quality of the printed patterns. According to the OPC technology, the optical distortion issue, which is caused by interference and diffraction, may be predicted by a simulation process using an OPC model. The designed layout may be corrected or biased, based on the predicted result. Based on the corrected layout, image patterns may be formed on the photomask 1400, and in this case, the patterns may be formed in desired shapes on the substrate SUB.

A layout of a semiconductor device may include a plurality of layers. In an embodiment of the present inventive concept, the OPC step may be performed to correct a layout for each of the layers. That is, the OPC step may be independently performed on each of the layers. A semiconductor device may be fabricated by sequentially realizing the plurality of layers on a substrate through a semiconductor process. As an example, the semiconductor device may include a plurality of metal layers, which are stacked to realize a specific circuit.

Figure 4:
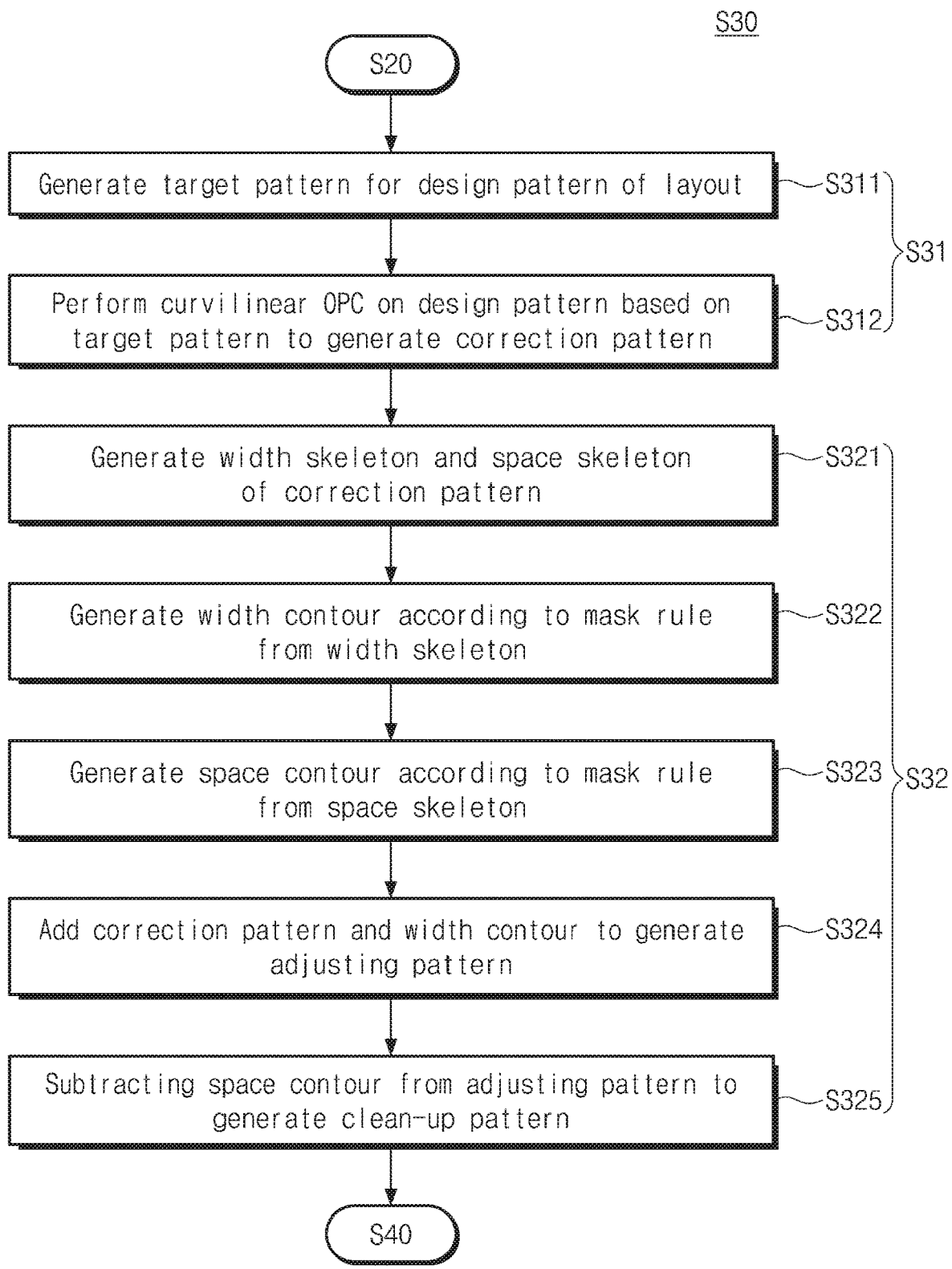
FIG. 4 is a flow chart schematically illustrating some steps in an optical proximity correction process according to an embodiment of the present inventive concept.

FIG. 4 is a flow chart schematically illustrating some steps in an optical proximity correction process according to an embodiment of the present inventive concept. For example, some steps of the data preparation step S30 being performed between the layout design step S20 and generate mask step S40 may be illustrated in FIG. 4. FIGS. 5 to 11 are layout plan views illustrating the optical proximity correction process of FIG. 4.

Figure 5:
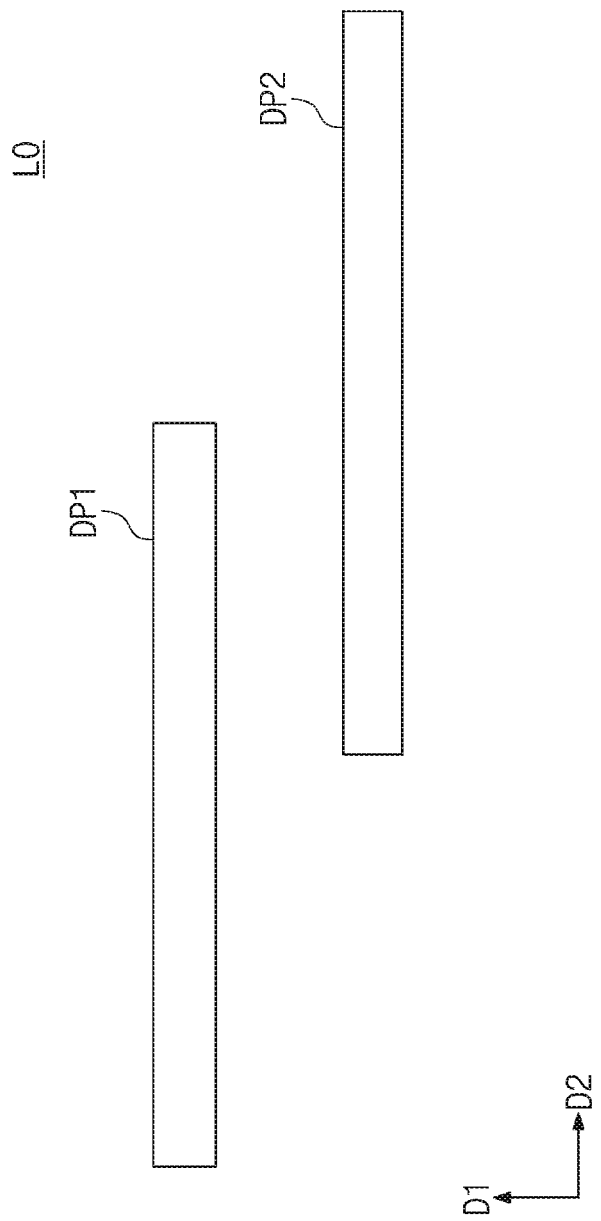
FIGS. 5 to 11 are layout plan views illustrating the optical proximity correction process of FIG. 4.

Referring to FIGS. 4 and 5, a layout LO, which is generated through the layout design step S20 previously described with reference to FIG. 2, may be provided. The layout LO may be a layout of a single layer.

The layout LO may include a plurality of design patterns DP1 and DP2. For example, the layout LO may include a first design pattern DP1 and a second design pattern DP2. Each of the first and second design patterns DP1 and DP2 may have a line shape extending in a second direction D2. The first and second design patterns DP1 and DP2 may be spaced apart from each other in a first direction D1. In other words, each of the first and second design patterns DP1 and DP2 may be a line-and-space pattern. Here, the layout LO may define shapes, positions, and sizes of the line-and-space pattern including the first and second design patterns DP1 and DP2, which will be actually formed on a silicon (Si) wafer.

A data preparation step may be performed on the layout LO including the first and second design patterns DP1 and DP2 (in S30). An OPC step may be first performed on the first and second design patterns DP1 and DP2 (in S31), and this will be described below.

Figure 6:
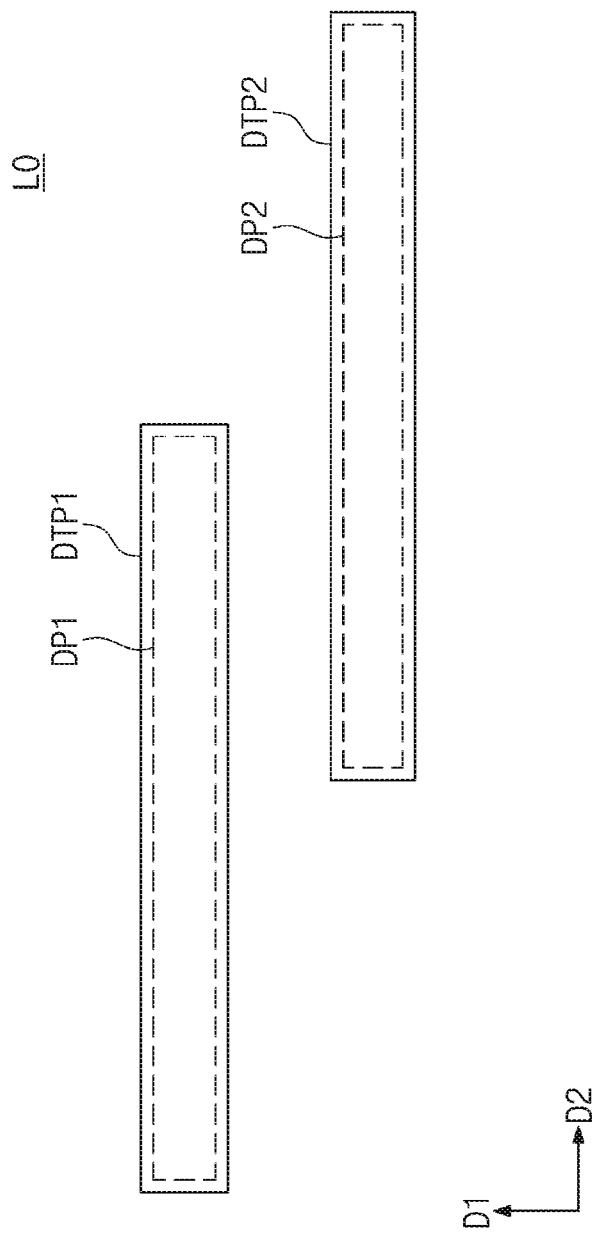

Referring to FIGS. 4 and 6, first and second target patterns DTP1 and DTP2 for the first and second design patterns DP1 and DP2 may be respectively generated (in S311). Each of the first and second target patterns DTP1 and DTP2 may be generated from a corresponding design pattern through a table driven layout operation (TDLO) step.

Each of the first and second target patterns DTP1 and DTP2 may define a size of a pattern (hereinafter, a photoresist pattern), which will be formed from a photoresist layer through a photolithography process. Each of the first and second target patterns DTP1 and DTP2 may define a desired size and shape of a photoresist pattern to be actually developed.

According to an embodiment of the present inventive concept, each of the first and second design patterns DP1 and DP2 may define a size and shape of a final pattern, which will be formed in an etch target layer under the photoresist layer. The final pattern in the etch target layer may be formed to have a size smaller than that of the photoresist pattern formed by the photolithography process. This is because an inclined etching profile occurs during patterning the etch target layer using the photoresist pattern as an etch mask. In sum, the generating of the target pattern (in S311) may be a step that is performed to reduce a difference in size between the photoresist pattern, which is formed by developing the photoresist layer, and the final pattern, which is formed in the etch target layer by etching the etch target layer with the photoresist pattern as an etch mask.

Figure 7:
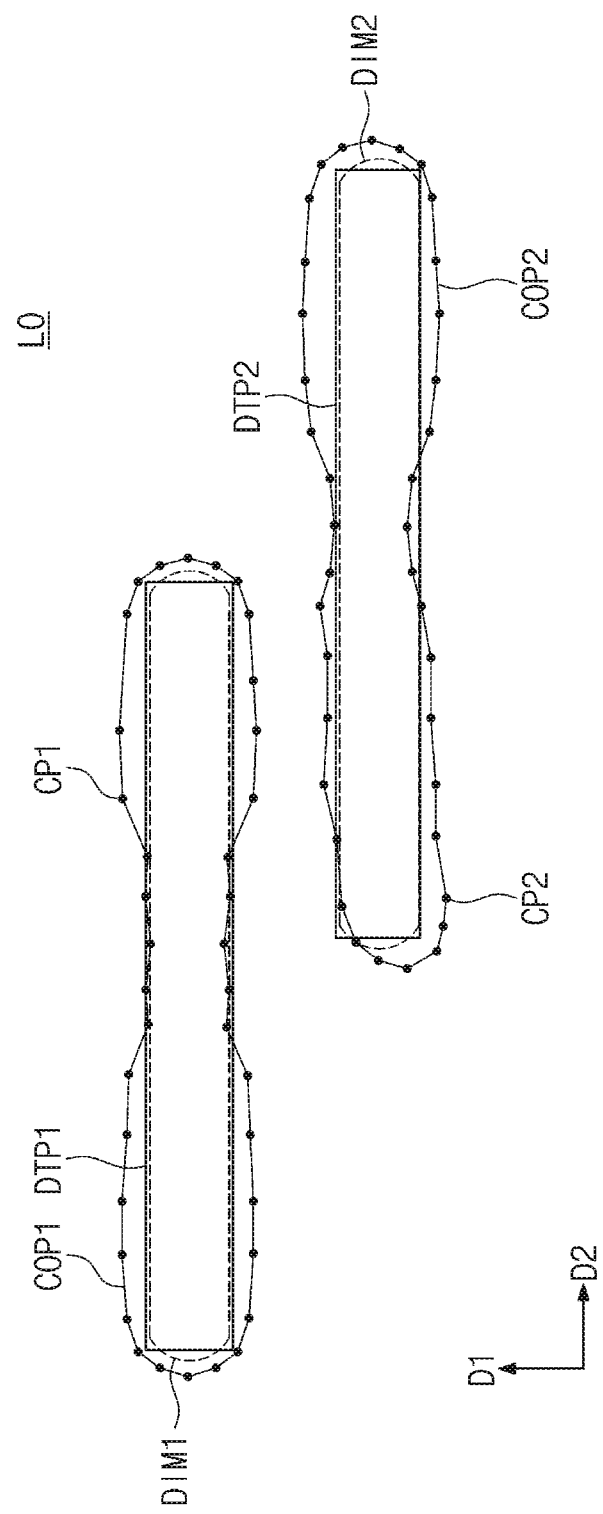

Referring to FIGS. 4 and 7, first and second correction patterns COP1 and COP2 may be respectively generated by performing a curvilinear OPC step on the first and second design patterns DP1 and DP2 based on the first and second target patterns DTP1 and DTP2 (in S312).

An OPC step may be performed on the first and second design patterns DP1 and DP2, based on each of the first and second target patterns DTP1 and DTP2 generated above. Thus, the first and second correction patterns COP1 and COP2 may be respectively generated from the first and second design patterns DP1 and DP2.

The first correction pattern COP1 may have a first simulation image DIM1, which is generated through a simulation process using an OPC model. The first correction pattern COP1 may be generated through the OPC simulation process such that the first simulation image DIM1 maximally conforms to the first target pattern DTP1 in its size and position. For example, the first simulation image DIM1 may be extracted through simulation, by inputting the mask data based on the first correction pattern COP1 into the OPC model.

The second correction pattern COP2 may have a second simulation image DIM2, which is generated through a simulation process using an OPC model. The second correction pattern COP2 may be generated through the OPC simulation process such that the second simulation image DIM2 maximally conforms to the second target pattern DTP2 in its size and position. For example, the second simulation image DIM2 may be extracted through simulation, by inputting the mask data based on the second correction pattern COP2 into the OPC model.

The OPC step according to the present embodiment may include a curvilinear OPC. In detail, by using an inverse lithography technology (ILT), which is one of OPC methods, each of the first and second correction patterns COP1 and COP2 may be generated in a curvilinear shape. In other words, an OPC correction pattern according to the present embodiments may have a curvilinear shape, not a polygonal shape.

In the case where the correction pattern has a curvilinear shape as a result of the curvilinear OPC, the correction pattern possesses the following better technical features, compared with a conventional (i.e., polygonal) correction pattern obtained by a Manhattan OPC. First, the use of the curvilinear pattern may make it possible to effectively exploit an area of the mask layout, compared with the Manhattan-shaped pattern, during the OPC step and thus, the mask rule may be more easily satisfied. In the process of fabricating the photomask 1400, the curvilinear pattern on the photomask 1400 may be more precisely realized, compared with the Manhattan-shaped pattern with sharp corners. This is because the curvilinear pattern, rather than the Manhattan-shaped pattern, may be more precisely realized by an e-beam patterning process, which is performed on a chromium layer and is a part of the process of fabricating the photomask 1400. Furthermore, in the case of the curvilinear pattern rather than the Manhattan-shaped pattern, a desired size and a desired shape of an actual photoresist pattern, which is formed by a developing step of a photolithography process, may be more precisely realized.

The first correction pattern COP1 may include a plurality of first points CP1. The first correction pattern COP1 may be generated by sequentially connecting the first points CP1. The first points CP1 may contain information on a position of the first correction pattern COP1. The first points CP1 may define a contour of the first correction pattern COP1. The first correction pattern COP1 may be realized in a curvilinear shape, not in a polygonal shape, by modifying positions of the first points CP1 and a way of connecting the first points CP1. In other words, the OPC step may include generating the first target pattern DTP1 from the first design pattern DP1 of the layout, and generating the first points CP1 that allow an OPC simulation image to correspond to the first target pattern DTP1, in which the first points CP1 may be connected to define the curvilinear shape of the first correction pattern COP1. The second correction pattern COP2 may include a plurality of second points CP2. The second points CP2 may be provided in the same or similar manner as the first points CP1.

The first and second correction patterns COP1 and COP2, which are a result of the OPC step, may be generated through the afore-described step. Thereafter, an MRC step may be performed on the first and second correction patterns COP1 and COP2 (in S32), and this will be described below.

Figure 8:
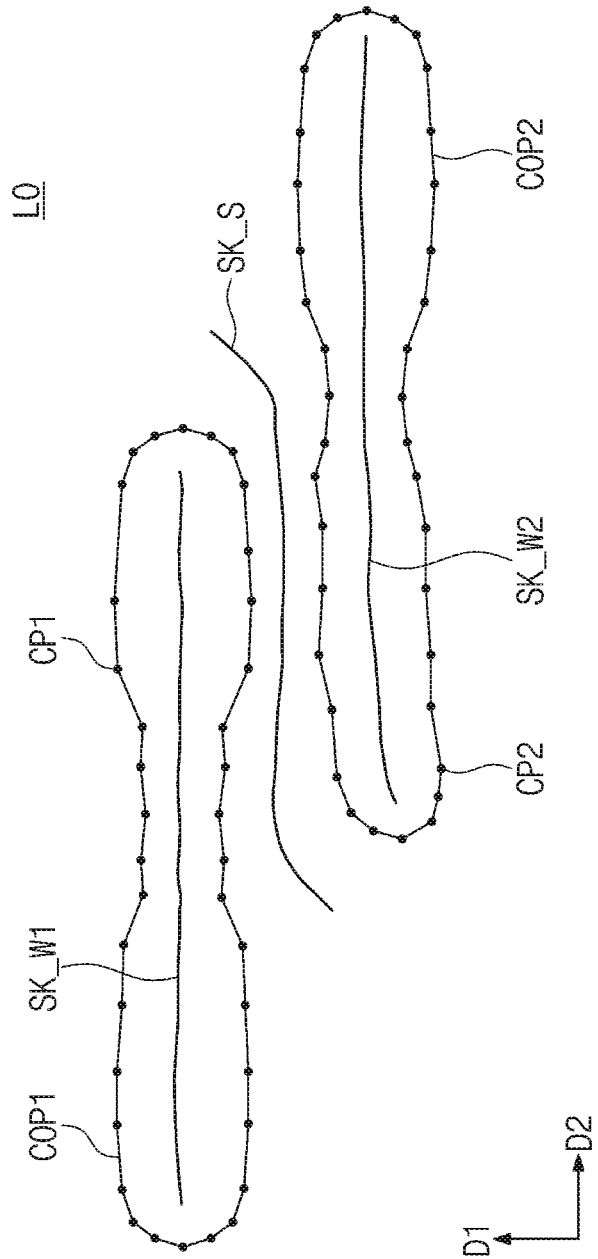

Referring to FIGS. 4 and 8, an MRC step S32 may be performed to check a mask rule on the first and second correction patterns COP1 and COP2 of the curvilinear shape and to correct an error violating the mask rule. According to an embodiment of the present inventive concept, the first and second correction patterns COP1 and COP2 may have a curvilinear shape defined by a plurality of points, and here, if each point is moved to correct an error, the MRC step may become very complex, and moreover, an additional error may occur easily. Thus, a width skeleton and a space skeleton may be used in the MRC step according to an embodiment of the present inventive concept, for convenience and efficiency.

A first width skeleton SK_W1 of the first correction pattern COP1 may be generated, and a second width skeleton SK_W2 of the second correction pattern COP2 may be generated (in S321). The first width skeleton SK_W1 may be generated based on the first points CP1, and the second width skeleton SK_W2 may be generated based on the second points CP2. For example, the generation of the first width skeleton SK_W1 may be performed using position information on the first points CP1 of the first correction pattern COP1, and the generation of the second width skeleton SK_W2 may be performed using position information on the second points CP2 of the second correction pattern COP2.

The first width skeleton SK_W1 may be a line passing through a center of the first correction pattern COP1. Center points may be defined between the first points CP1 facing each other, and the first width skeleton SK_W1 may be generated by sequentially connecting the center points of the first correction pattern COP1. Similarly, the second width skeleton SK_W2 may be a line passing through a center of the second correction pattern COP2. Center points may be defined between the second points CP2 facing each other, and the second width skeleton SK_W2 may be generated by sequentially connecting the center points of the second correction pattern COP2.

A space skeleton SK_S may be generated between the first correction pattern COP1 and the second correction pattern COP2 (in S321). The space skeleton SK_S may be generated based on the first and second points CP1 and CP2 facing each other. For example, the generation of the space skeleton SK_S may be performed using position information on the first points CP1 of the first correction pattern COP1 and the second points CP2 of the second correction pattern COP2. For example, the space skeleton SK_S may be a line passing through a center of a region between the first and second correction patterns COP1 and COP2. Center points may be defined between the first and second points CP1 and CP2 facing each other, and the space skeleton SK_S may be generated by sequentially connecting the center points between the first and second correction patterns COP1 and COP2.

Figure 9:
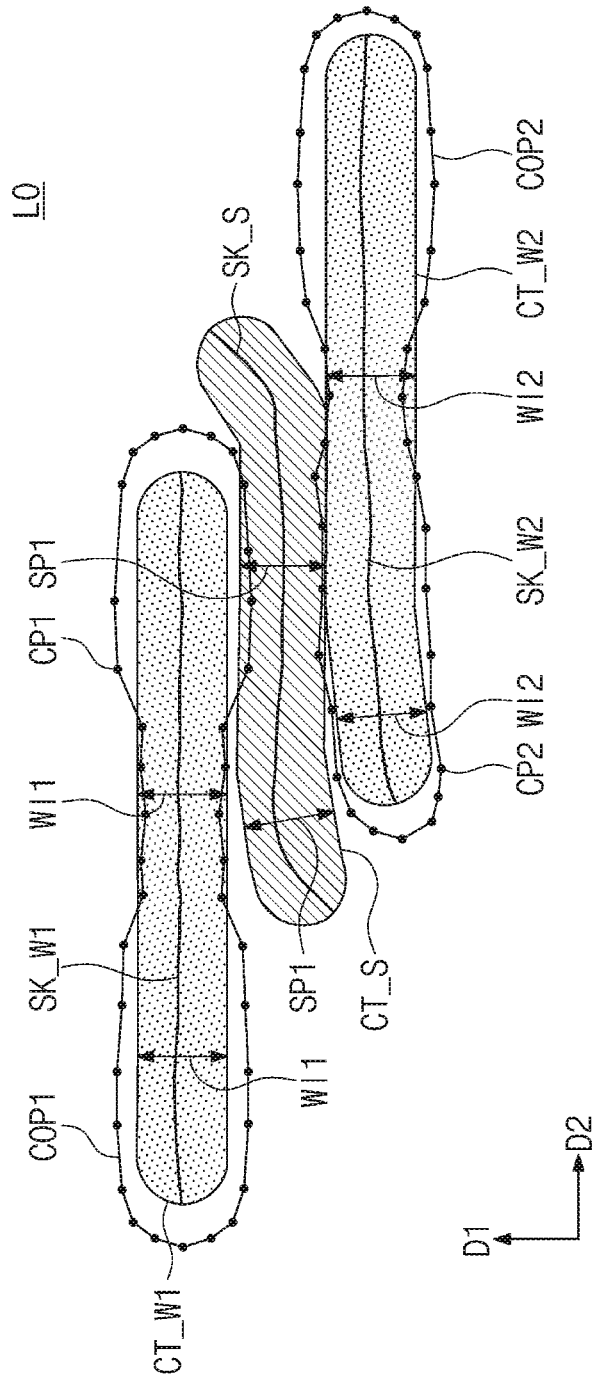

Referring to FIGS. 4 and 9, first and second width contours CT_W1 and CT_W2 according to the mask rule may be respectively generated from the first and second width skeletons SK_W1 and SK_W2 (in S322). In detail, the first width contour CT_W1 satisfying specifications of the mask rule for linewidths may be generated from the first width skeleton SK_W1. In the case where the linewidth specification of the mask rule for the first correction pattern COP1 is a first width WI1, the first width contour CT_W1 may be generated to have a linewidth satisfying the first width WI1 The first width contour CT_W1 may be generated such that a width of the first width skeleton SK_W1 in its normal direction, for example, the first direction D1, becomes the first width WI1. For example, the first width WI1 may be the minimum linewidth of the first correction pattern COP1 defined by the mask rule.

The second width contour CT_W2 satisfying specifications of the mask rule for linewidths may be generated from the second width skeleton SK_W2. In the case where the linewidth specification of the mask rule for the second correction pattern COP2 is a second width WI2, the second width contour CT_W2 may be generated to have a linewidth satisfying the second width WI2. The second width contour CT_W2 may be generated such that a width of the second width skeleton SK_W2 in its normal direction, for example, the first direction D1, becomes the second width WI2. For example, the second width WI2 may be the minimum linewidth of the second correction pattern COP2 defined by the mask rule. The second width WI2 may be equal to or different from the first width WI1.

A space contour CT_S according to the mask rule may be generated from the space skeleton SK_S (in S323). In detail, the space contour CT_S, which satisfies a specification of the mask rule for a space between adjacent ones of the first and second correction patterns COP1 and COP2, may be generated from the space skeleton SK_S. In the case where the space specification of the mask rule for the space between the first and second correction patterns COP1 and COP2 is a first space SP1, the space contour CT_S may be generated to have a linewidth satisfying the first space SP1. The space contour CT_S may be generated such that a width of the space skeleton SK_S in its normal direction becomes the first space SP1. For example, the first space SP1 may be the minimum space between the first and second correction patterns COP1 and COP2 defined by the mask rule.

Figure 10:
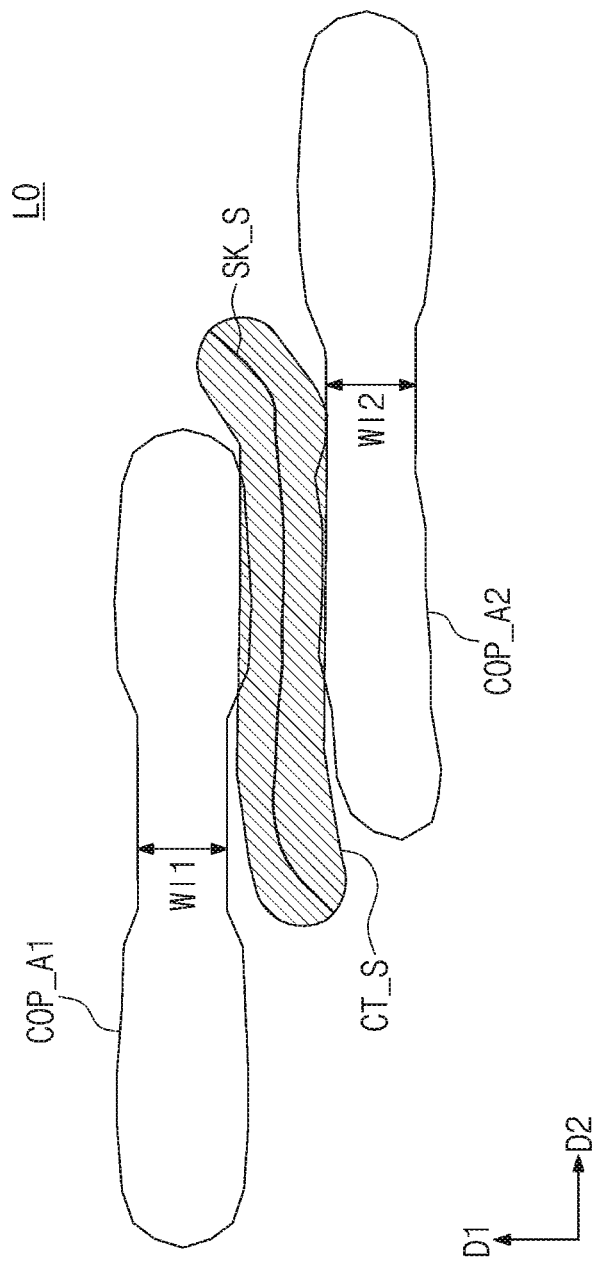

Referring to FIGS. 4 and 10, a first adjusting pattern COP_A1 may be generated by adding the first correction pattern COP1 and the first width contour CT_W1, and a second adjusting pattern COP_A2 may be generated by adding the second correction pattern COP2 and the second width contour CT_W2 (in S324).

A Boolean "OR" operation may be performed on the first correction pattern COP1 and the first width contour CT_W1 to generate the first adjusting pattern COP_A1, in which the first correction pattern COP1 and the first width contour CT_W1 are added.

The first correction pattern COP1 of the curvilinear shape may include a region whose linewidth is smaller than the first width WI1. However, as a result of the addition of the first correction pattern COP1 and the first width contour CT_W1, the minimum linewidth of the first adjusting pattern COP_A1 may satisfy the first width WI1. For example, the minimum linewidth of the first adjusting pattern COP_A1 may satisfy the specification of the mask rule for the linewidth. For example, since the linewidth specification of the mask rule for the first correction pattern COP1 is the first width WI1, the first adjusting pattern COP_A1 generated through the "OR" operation may have the first width WI1 as its minimum linewidth to satisfy the specification of the mask rule for the linewidth.

The second correction pattern COP2 of the curvilinear shape may include a region whose linewidth is smaller than the second width WI2. However, as a result of the addition of the second correction pattern COP2 and the second width contour CT_W2, the minimum linewidth of the second adjusting pattern COP_A2 may satisfy the second width WI2. For example, the minimum linewidth of the second adjusting pattern COP_A2 may satisfy the specification of the mask rule for the linewidth. For example, since the linewidth specification of the mask rule for the second correction pattern COP2 is the second width WI2, the second adjusting pattern COP_A2 generated through the "OR" operation may have the second width WI2 as its minimum linewidth to satisfy the specification of the mask rule for the linewidth.

The first and second adjusting patterns COP_A1 and COP_A2 may satisfy the linewidth specification of the mask rule. In other words, the first and second adjusting patterns COP_A1 and COP_A2 may be a result that is obtained by removing an error violating the mask rule for the linewidth from the first and second correction patterns COP1 and COP2.

Figure 11:
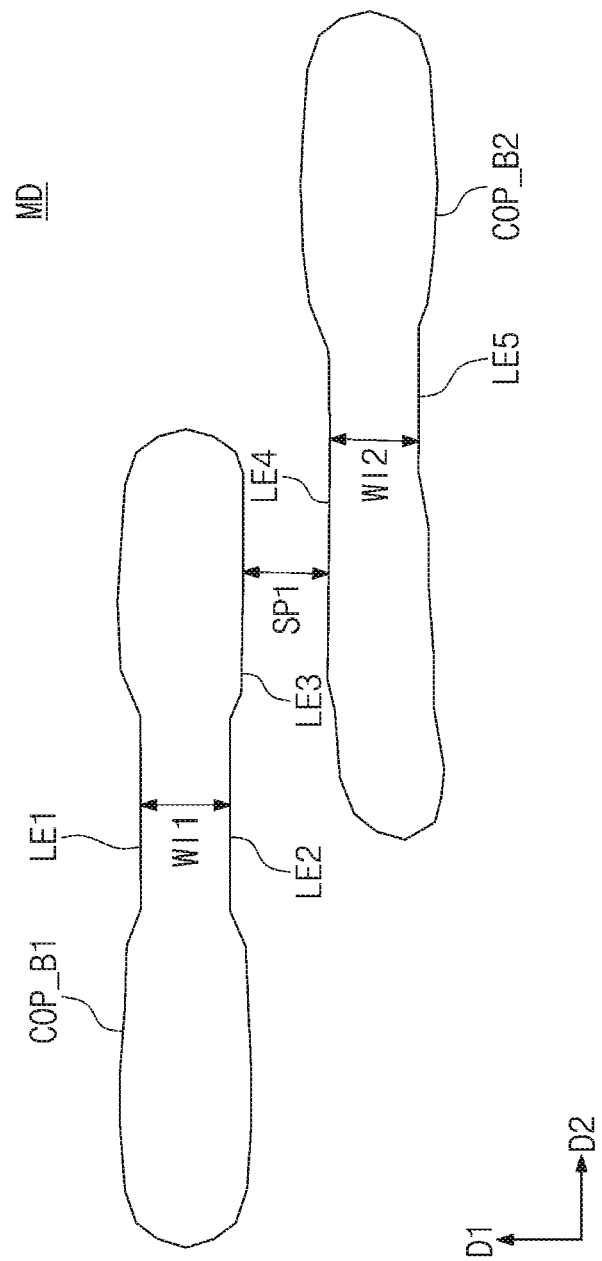

Referring to FIGS. 4 and 11, first and second clean-up patterns COP_B1 and COP_B2 may be respectively generated by subtracting the space contour CT_S from the first and second adjusting patterns COP_A1 and COP_A2 (in S325).

A Boolean "SUB" operation may be performed on the first adjusting pattern COP_A1 and the space contour CT_S. The "SUB" operation may include removing a region of the first adjusting pattern COP_A1, which is overlapped with the space contour CT_S, from the first adjusting pattern COP_A1. The first clean-up pattern COP_B1 may be generated from the first adjusting pattern COP_A1 through the "SUB" operation.

A Boolean "SUB" operation may be performed on the second adjusting pattern COP_A2 and the space contour CT_S. The "SUB" operation may include removing a region of the second adjusting pattern COP_A2, which is overlapped with the space contour CT_S, from the second adjusting pattern COP_A2. The second clean-up pattern COP_B2 may be generated from the second adjusting pattern COP_A2 through the "SUB" operation.

The minimum space between the first correction pattern COP1 and the second correction pattern COP2 may be smaller than the first space SP1. However, since the regions of the first and second adjusting patterns COP_A1 and COP_A2, which are overlapped with the space contour CT_S, are removed, the minimum space between the first and second clean-up patterns COP_B1 and COP_B2 may satisfy the first space SP1. Since the first space SP1 may be the minimum space between the first and second correction patterns COP1 and COP2 defined by the mask rule, the minimum space (i.e., the first space SP1) between the first and second clean-up patterns COP_B1 and COP_B2 may satisfy the specification of the mask rule for the space between the first correction pattern COP1 and the second correction pattern COP2.

The first and second clean-up patterns COP_B1 and COP_B2 may satisfy specifications of the mask rule for a space between adjacent patterns. In other words, the first and second clean-up patterns COP_B1 and COP_B2 may be a result that is obtained by removing an error violating the mask rule for the space from the first and second adjusting patterns COP_A1 and COP_A2. For example, the first and second clean-up patterns COP_B1 and COP_B2 may be a result obtained by removing portions that violate the mask rule from the first and second correction patterns COP1 and COP2. The first and second clean-up patterns COP_B1 and COP_B2 may be output as a mask data MD that is a result from which all errors violating the mask rule are removed.

The first clean-up pattern COP_B1 of the mask data MD may include a first side LE1 and a second side LE2, which are opposite to each other in the first direction D1. Each of the first and second sides LE1 and LE2 may be a result, which is obtained by the modification using the first width contour CT_W1, and may have a linear shape, not a curvilinear shape. A space between the first and second sides LE1 and LE2 may have the first width WI1. Since the first and second sides LE1 and LE2 may not be overlapped with the space contour CT_S, and may not be affected by the "SUB" operation, the first adjusting pattern COP_A1 may also include the first side LE1 and the second side LE2, which are opposite to each other, and the space between the first and second sides LE1 and LE2 may correspond to the minimum linewidth, and the first and second sides LE1 and LE2 may have a linear shape.

The first clean-up pattern COP_B1 and the second clean-up pattern COP_B2 may include a third side LE3 and a fourth side LE4, respectively, which are opposite to each other. Each of the third and fourth sides LE3 and LE4 may be a result, which is obtained by the modification using the space contour CT_S, and may have a linear shape, not a curvilinear shape. A space between the third and fourth sides LE3 and LE4 may be the first space SP1.

The first clean-up pattern COP_B1 may include a fifth side LE5, which is opposite to the fourth side LE4 in the first direction D1. The fifth side LE5 may be a result, which is modified by the second width contour CT_W2, and may have a linear shape, not a curvilinear shape. A space between the fourth and fifth sides LE4 and LE5 may have the second width WI2. A photomask may be manufactured, based on the mask data MD which may include the output of the first and second clean-up patterns COP_B1 and COP_B2 obtained through the data preparation step (in S40).

Figure 12:
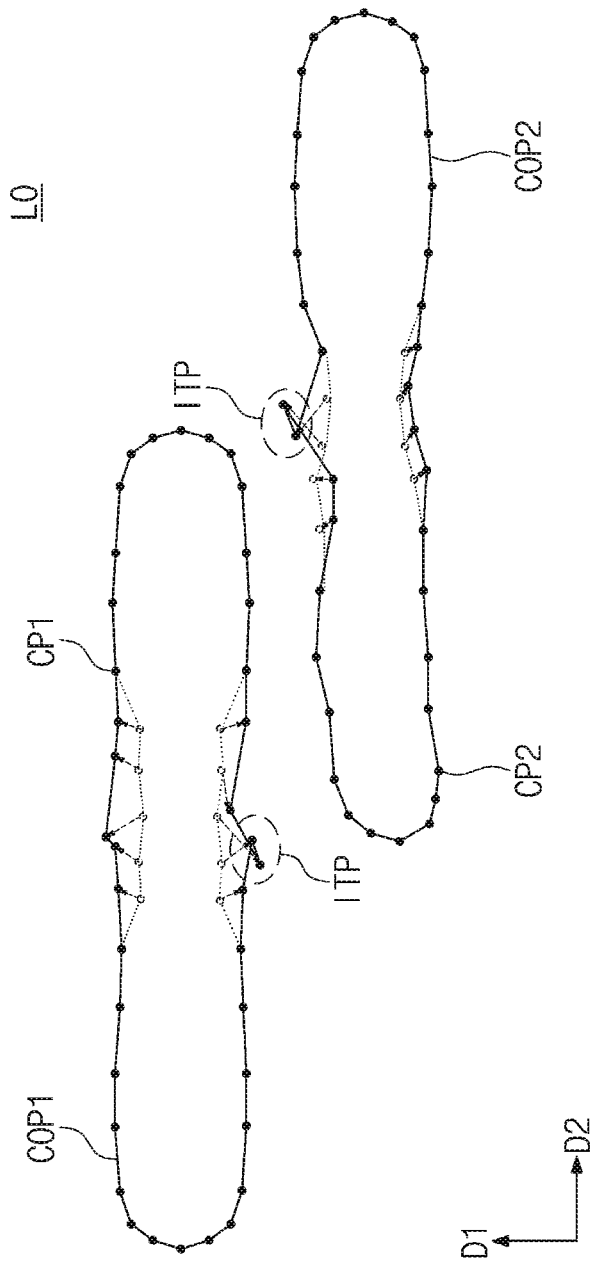
FIG. 12 is a layout plan view illustrating a mask rule check (MRC) step according to a comparative example.

FIG. 12 is a layout plan view illustrating an MRC step according to a comparative example. Referring to FIG. 12, a mask rule check (MRC) step may be performed on the first and second correction patterns COP1 and COP2 which are a result of the curvilinear OPC of FIG. 7. According to the comparative example, an error of a pattern through the MRC step may be modified by a method of biasing each of the first and second points CP1 and CP2.

Positions of some of the first points CP1 of the first correction pattern COP1 may be changed. The change or modification of the position of the first points CP1 may be performed for each point. In this case, the contour of the first correction pattern COP1 may be changed to a bumpy shape. For example, when a very small curvilinear shape compared to the MRC specification is generated, an unexpected shape change after clean-up may often occur. As an example, the first points CP1 may be moved such that lines connecting them intersect each other, and in this case, an intersection problem ITP causing an entanglement of the contour may occur.

For the second correction pattern COP2, positions of some of the second points CP2 may be changed in the same manner. Accordingly, the contour of the second correction pattern COP2 may be changed to a bumpy shape and in certain cases, the intersection problem ITP may occur.

In the case where, as in the comparative example, a step of moving each point CP1 or CP2 is performed to remove an error in the mask rule, there may be an error in a final shape of the clean-up pattern. To solve this problem, if each point is modified in consideration of relationship between neighboring points, an operation may become too complicated, and thus, efficiency in the MRC step may be deteriorated.

By contrast, in the MRC step according to an embodiment of the present inventive concept, the intersection problem ITP between neighboring points may not occur, unlike the comparative example of FIG. 12, and an operation, which is performed to obtain the clean-up pattern, may be simple and efficient. In other words, according to an embodiment of the present inventive concept, an MRC clean-up step on a curvilinear OPC result may be performed in a simple and efficient manner.

Figure 13:
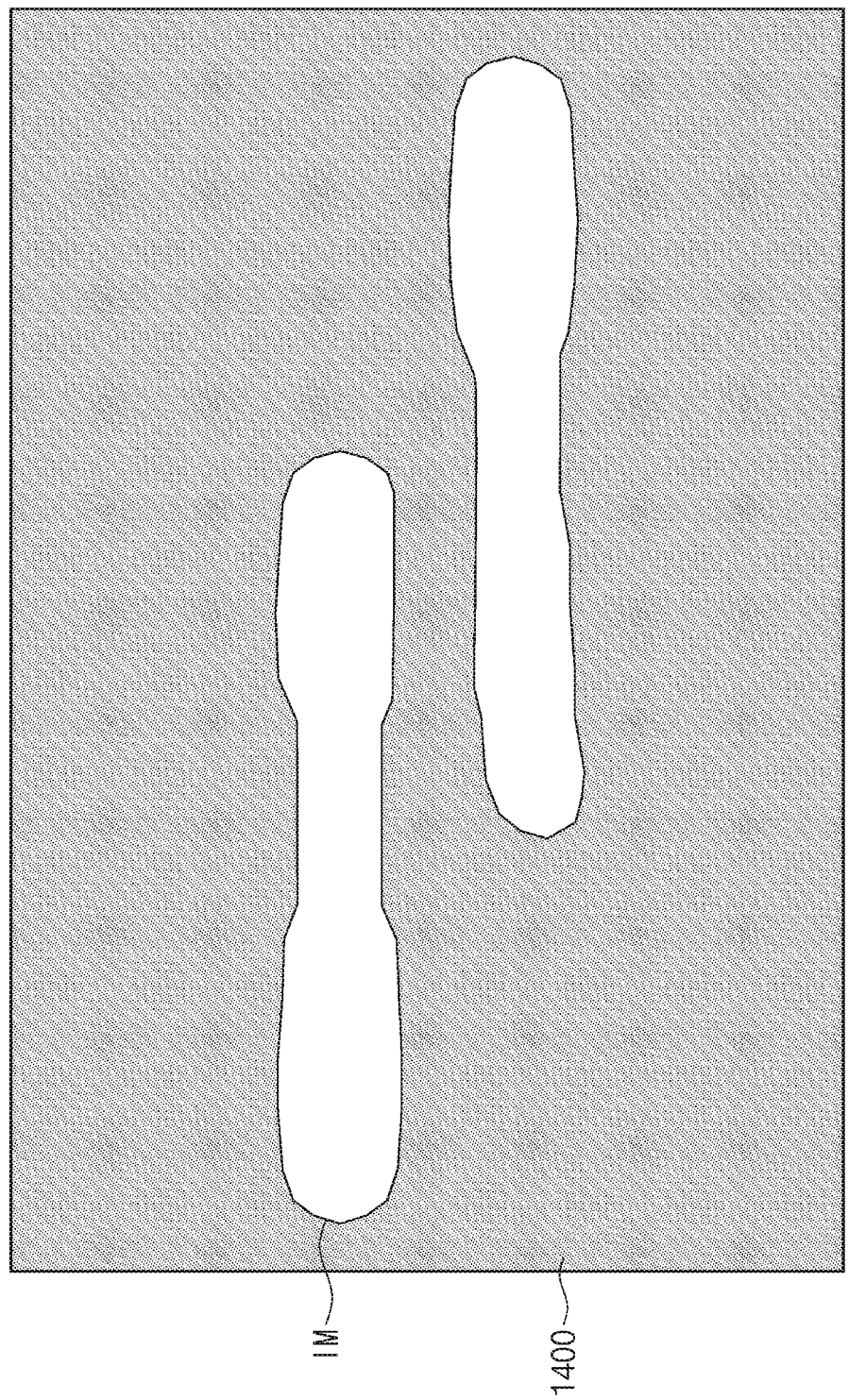
FIG. 13 is a plan view illustrating a photomask according to an embodiment of the present inventive concept.

FIG. 13 is a plan view illustrating a photomask according to an embodiment of the present inventive concept. Referring to FIGS. 2 and 13, the photomask 1400 may be manufactured (in S40), based on the mask data MD of FIG. 11 obtained through the data preparation step S30. The photomask 1400 may include image patterns IM. The image patterns IM may be formed based on the first and second clean-up patterns COP_B1 and COP_B2 of FIG. 11. The photomask 1400 may be manufactured by patterning a chromium layer provided on a glass substrate to include image patterns IM. For example, after the mask data preparation step S30 and before a lithographic process, a process of converting the mask data into pixel data may be performed. After the pixel data is generated, the lithographic process such as an electron beam writing process may be performed by irradiating an electron beam or multiple electron beams on a mask substrate based on the pixel data. After the lithographic process, a series of processes such as, for example, development, etching, and cleaning, may be performed to complete the photomask 1400.

The photomask 1400 may include a transparent region and an opaque region. The opaque region may be configured to prevent light from passing therethrough. By contrast, the transparent region may be configured to transmit light, which is emitted from the light source 1200 of FIG. 3. Light passing through the photomask 1400 may be provided to the substrate SUB of FIG. 3. For example, when the photolithography process is performed using a negative-type photoresist, the image patterns IM may be the transparent region of the photomask 1400.

Figure 14:
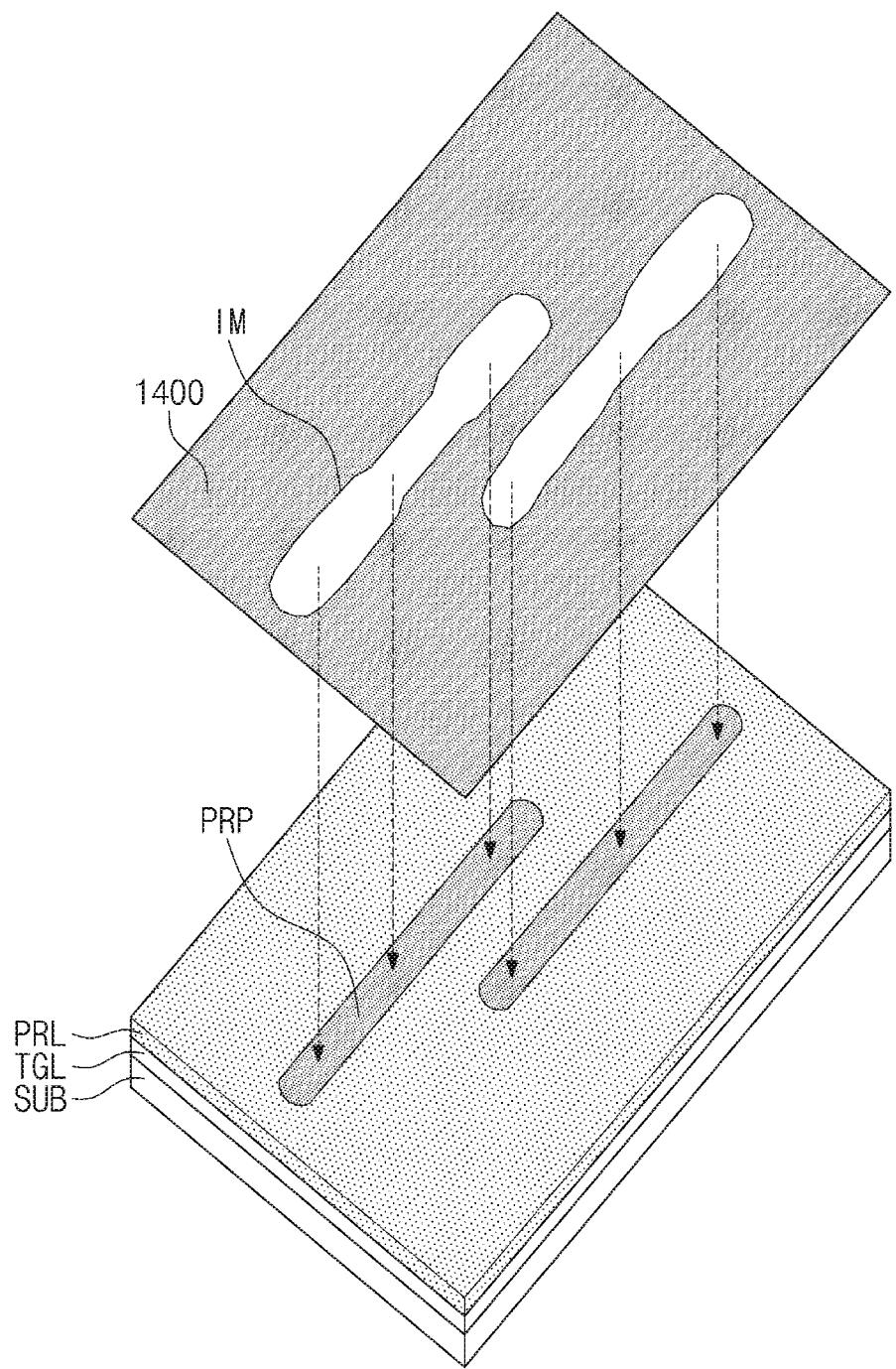
FIGS. 14 and 15 are conceptual diagrams illustrating a photolithography process performed using the photomask of FIG. 13.
Figure 15:
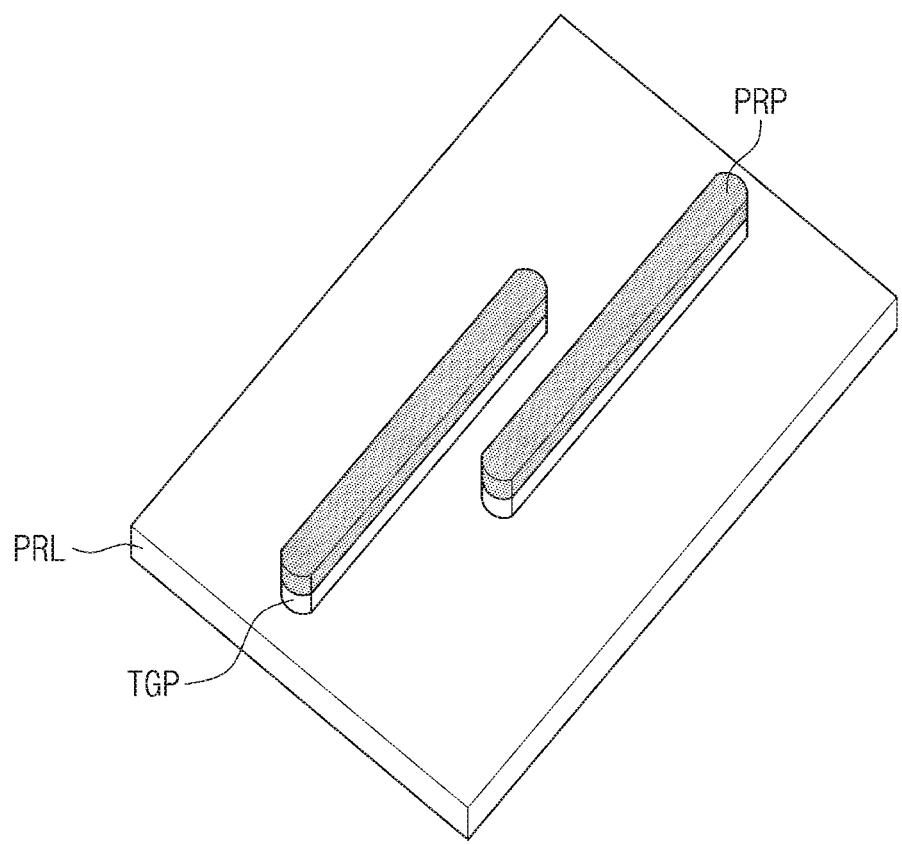

FIGS. 14 and 15 are conceptual diagrams illustrating a photolithography process performed using the photomask 1400 of FIG. 13. Referring to FIG. 14, the light source 1200 of FIG. 3 may be configured to emit light to the photomask 1400. The emitted light may pass through the transparent region of the image patterns IM and may be provided to a photoresist layer PRL on the substrate SUB (e.g., through an exposure process). A region of the photoresist layer PRL, onto which the light is irradiated, may become a photoresist pattern PRP. The photoresist patterns PRP may be formed to have the same shape and size as the simulation images DIM1 and DIM2 previously described with reference to FIG. 7.

Referring to FIG. 15, a developing process may be performed to leave the photoresist patterns PRP and to remove a remaining portion of the photoresist layer PRL. An etch target layer TGL on the substrate SUB may be patterned using the left photoresist patterns PRP as an etch mask. Accordingly, desired patterns TGP on the substrate SUB may be realized. The patterns TGP may be formed to have the same shape and size as the design patterns DP1 and DP2 previously described with reference to FIG. 5. As a result, by forming target patterns in each layer using this method, a semiconductor device may be fabricated (in S50 of FIG. 2).

Figure 16:
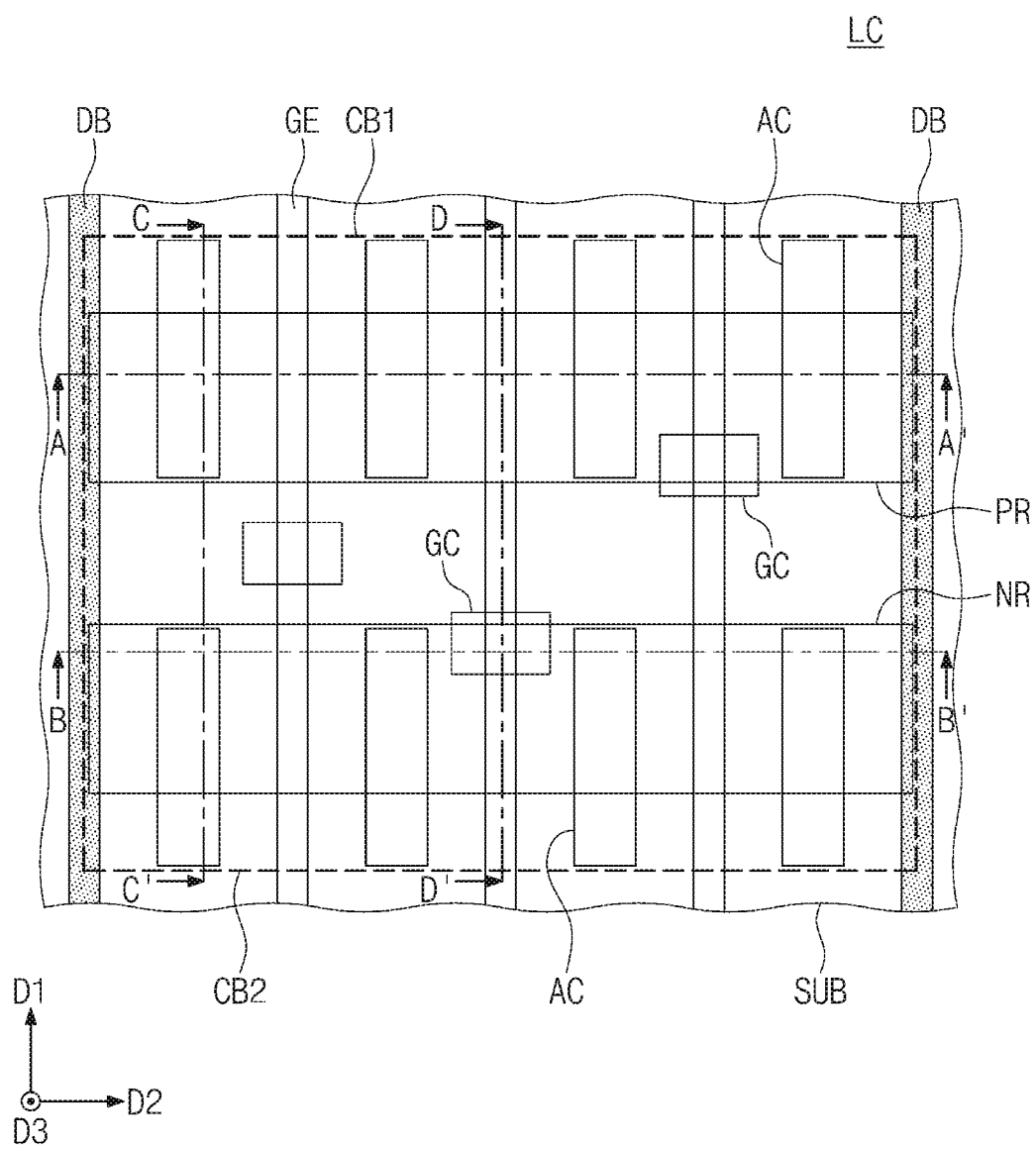
FIGS. 16 and 18 are plan views illustrating a method of fabricating a semiconductor device according to an embodiment of the present inventive concept.
Figure 17A:
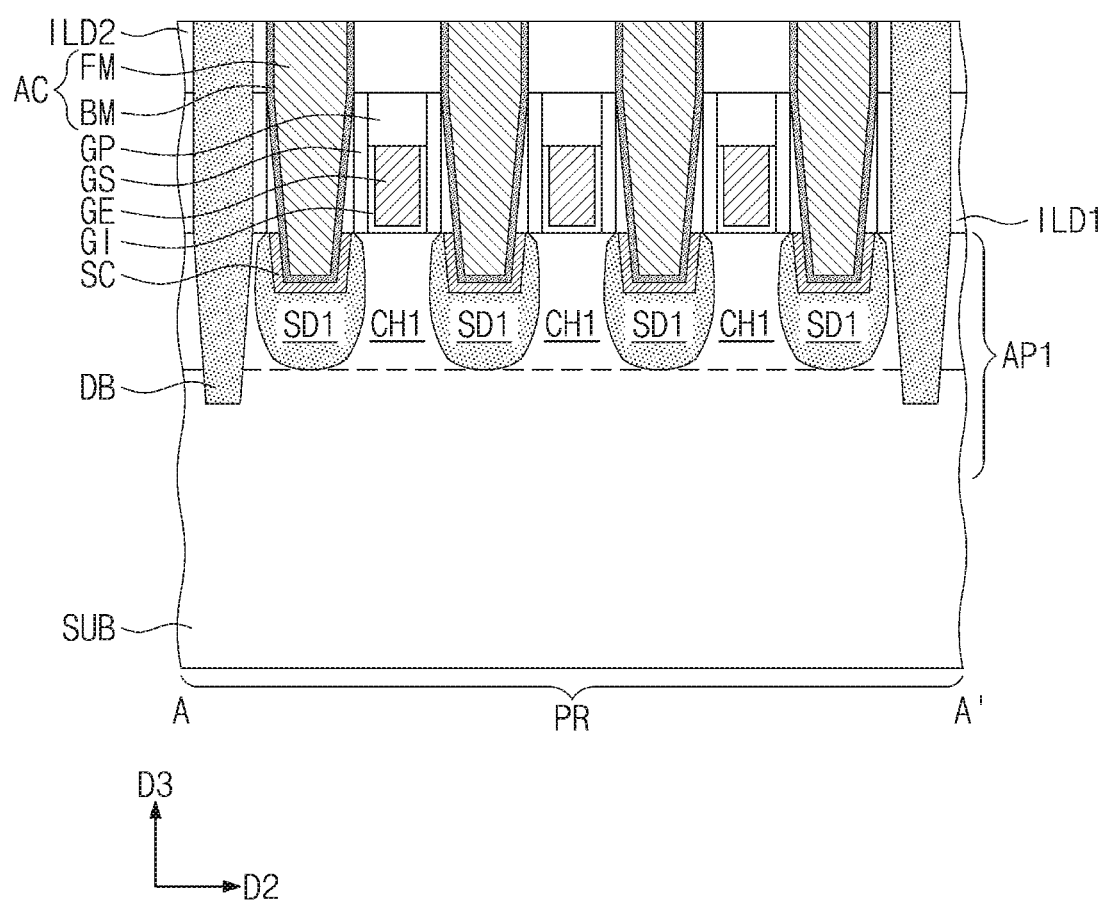
FIGS. 17A, 17B, 17C, and 17D are cross-sectional views, which are respectively taken along lines A-A', B-B', C-C', and D-D' of FIG. 16.
Figure 17B:
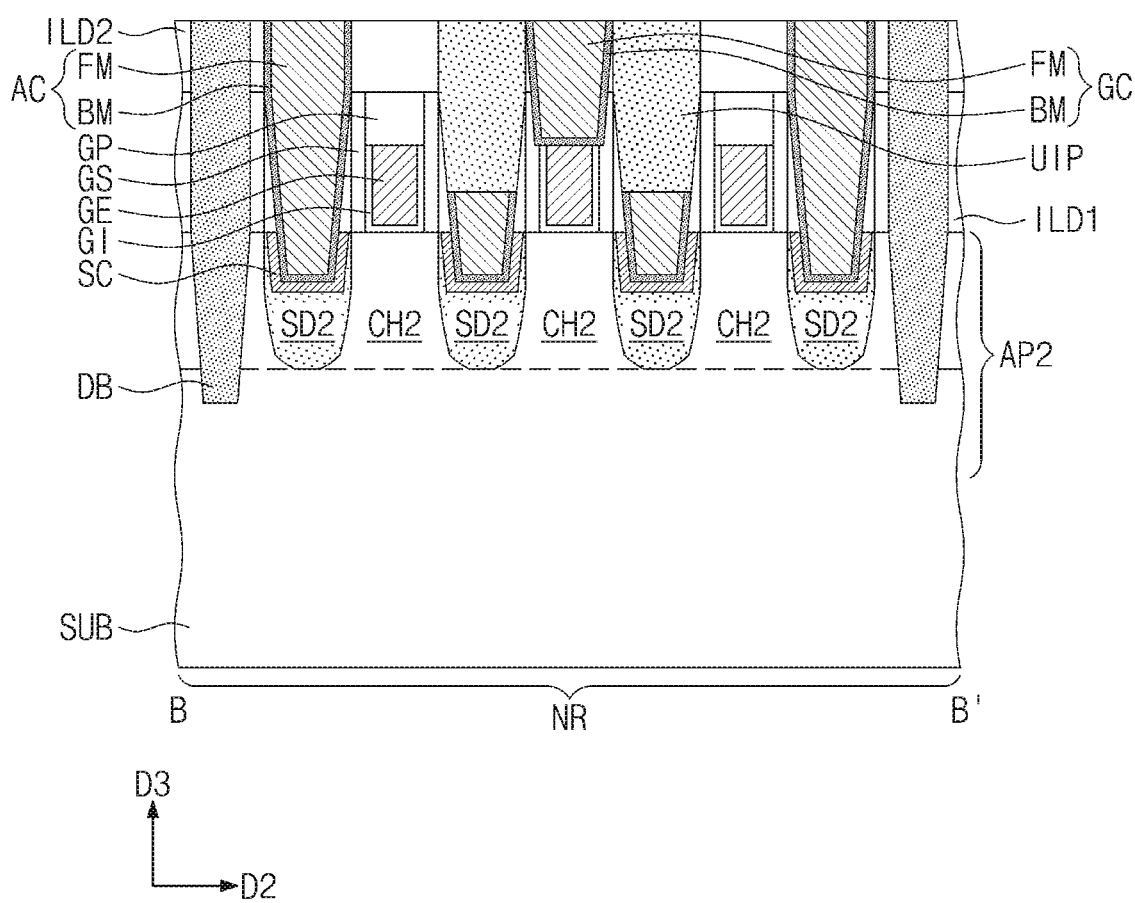
Figure 17C:
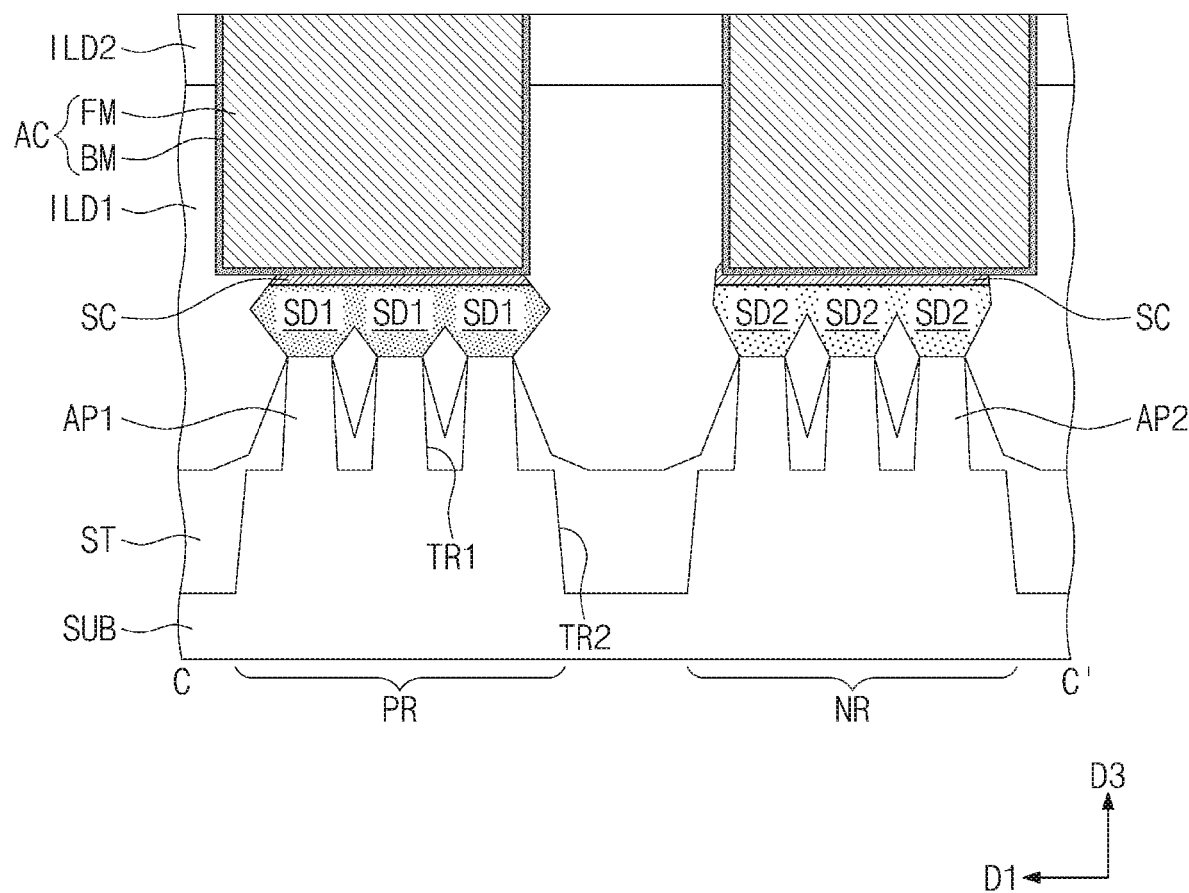
Figure 17D:
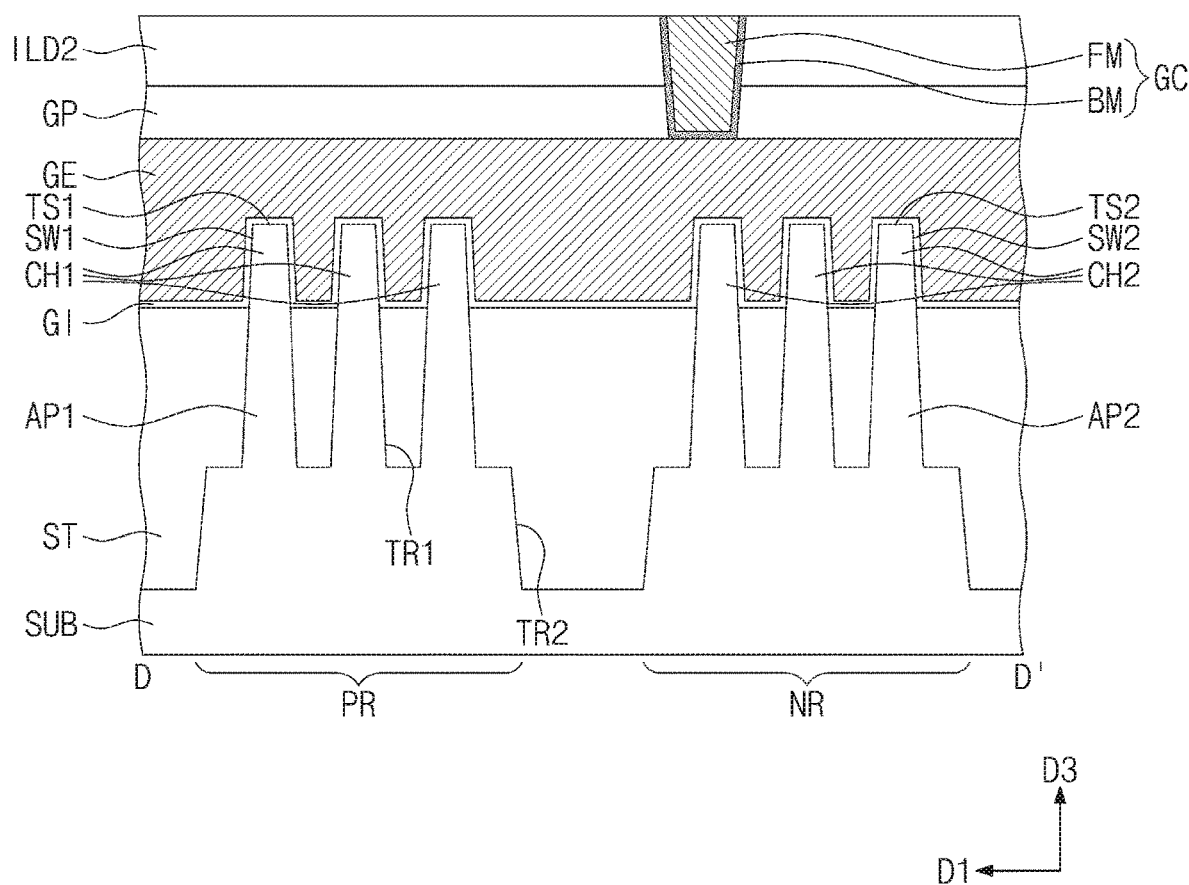
Figure 18:
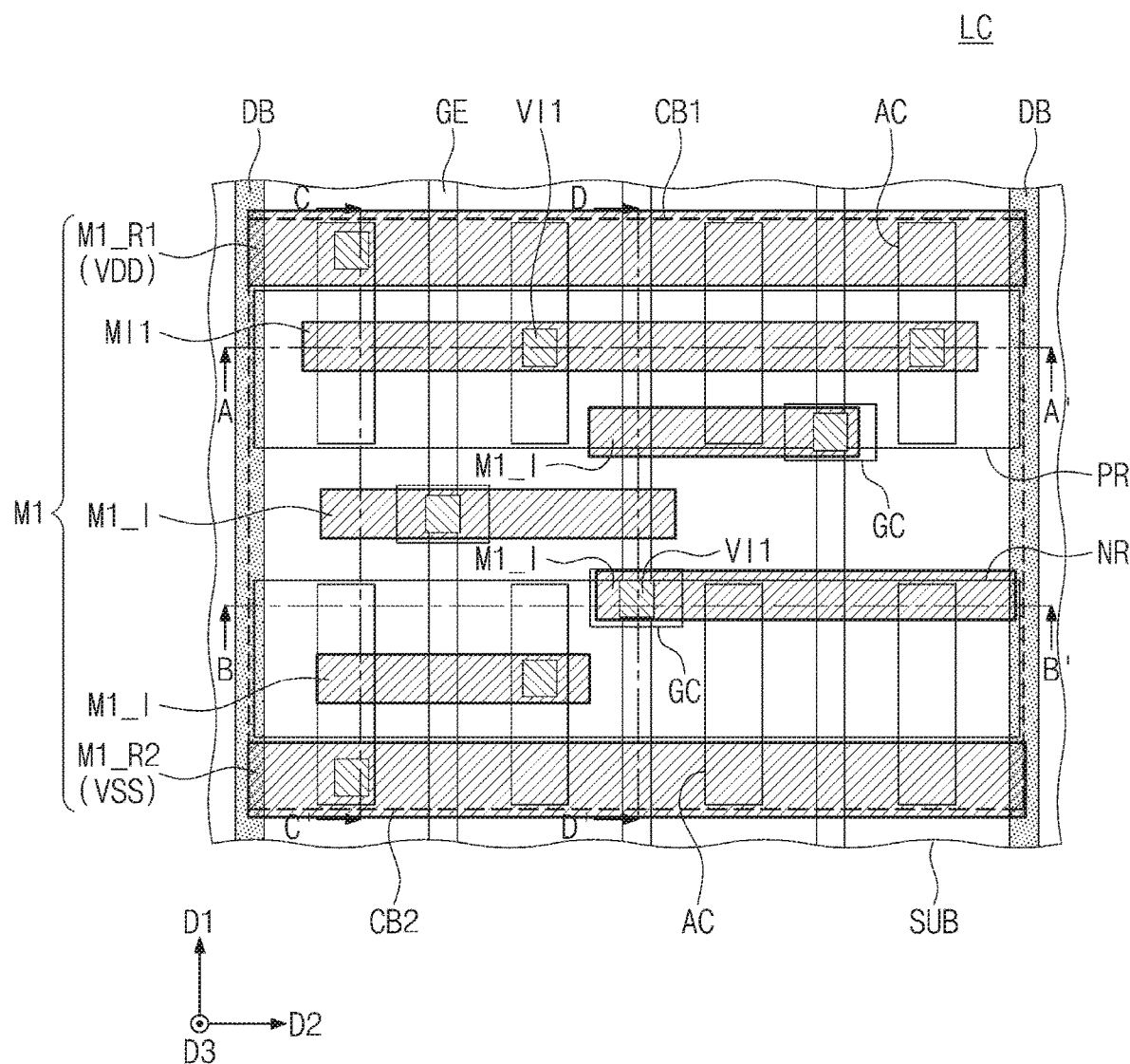
Figure 19A:
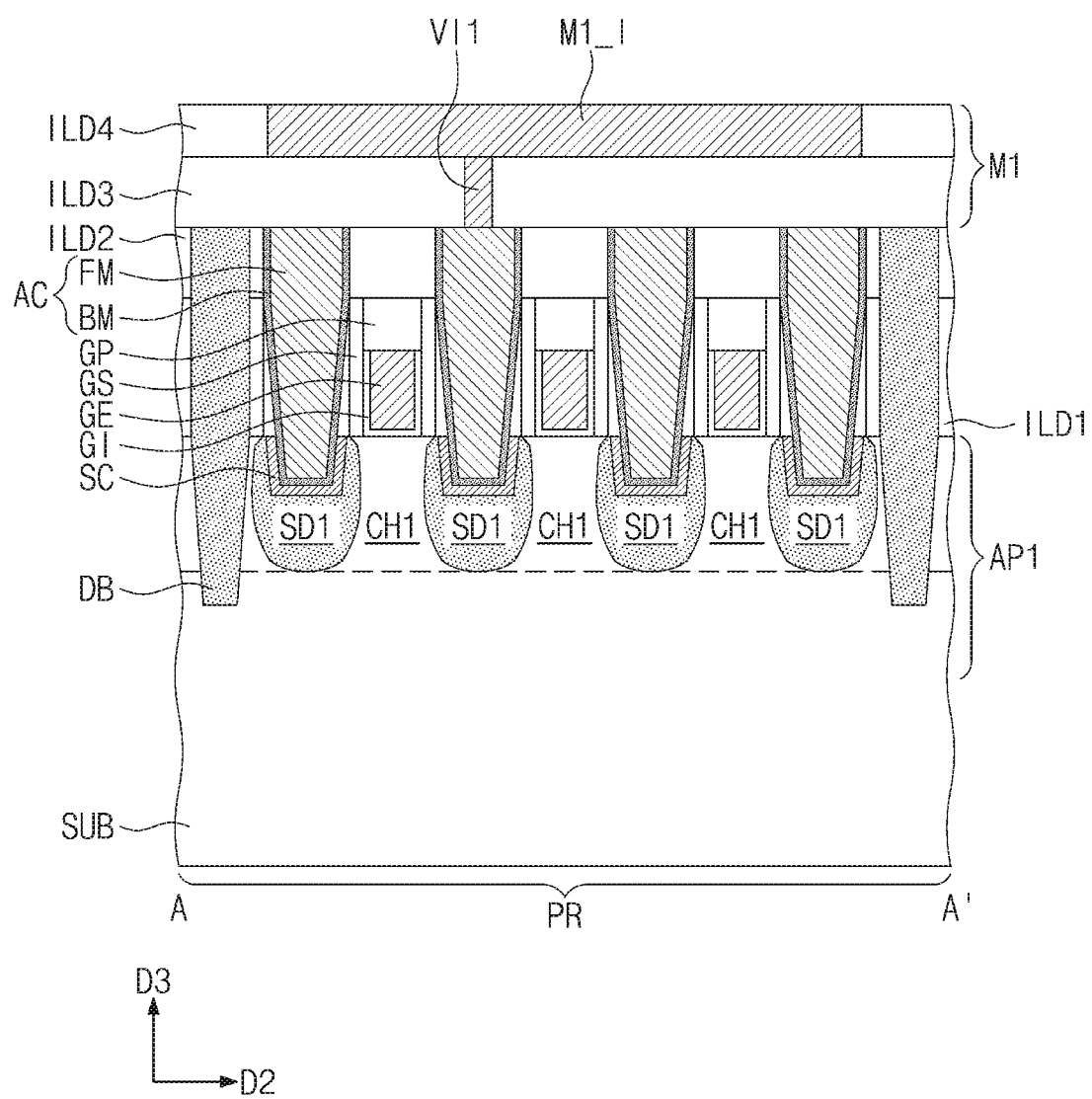
FIGS. 19A, 19B, 19C, and 19D are cross-sectional views, which are respectively taken along lines A-A', B-B', C-C', and D-D' of FIG. 18.
Figure 19B:
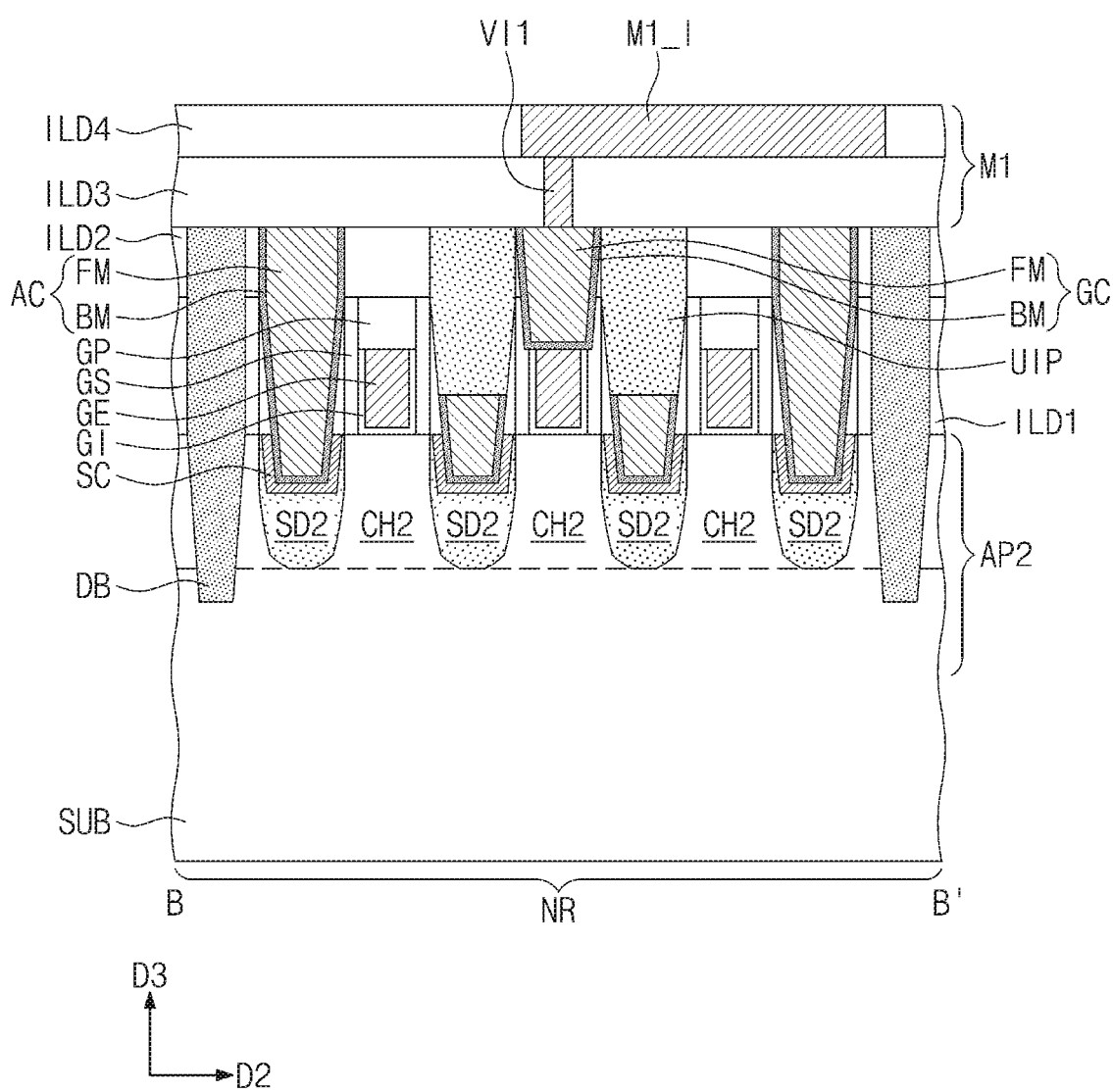
Figure 19C:
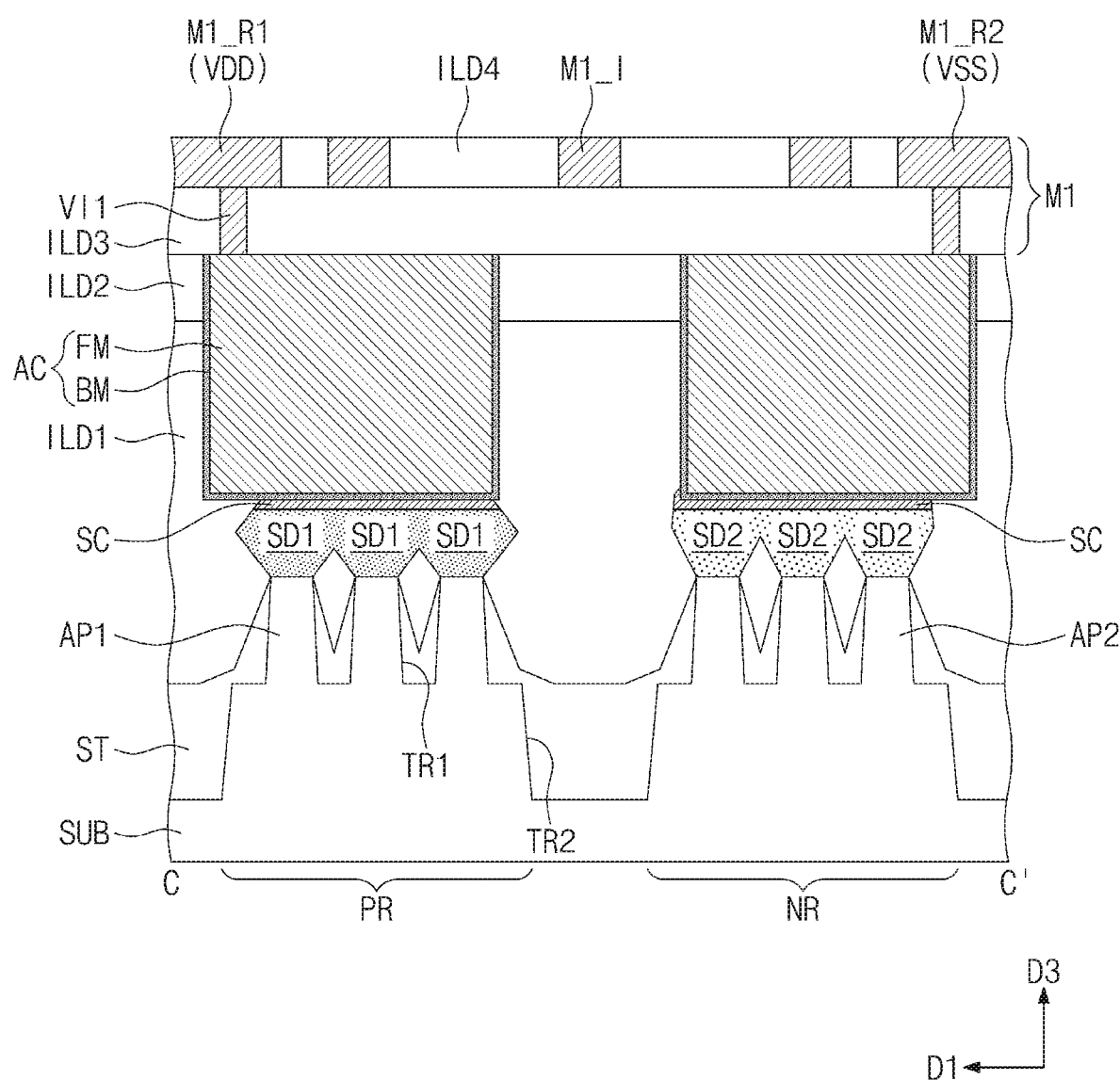
Figure 19D:
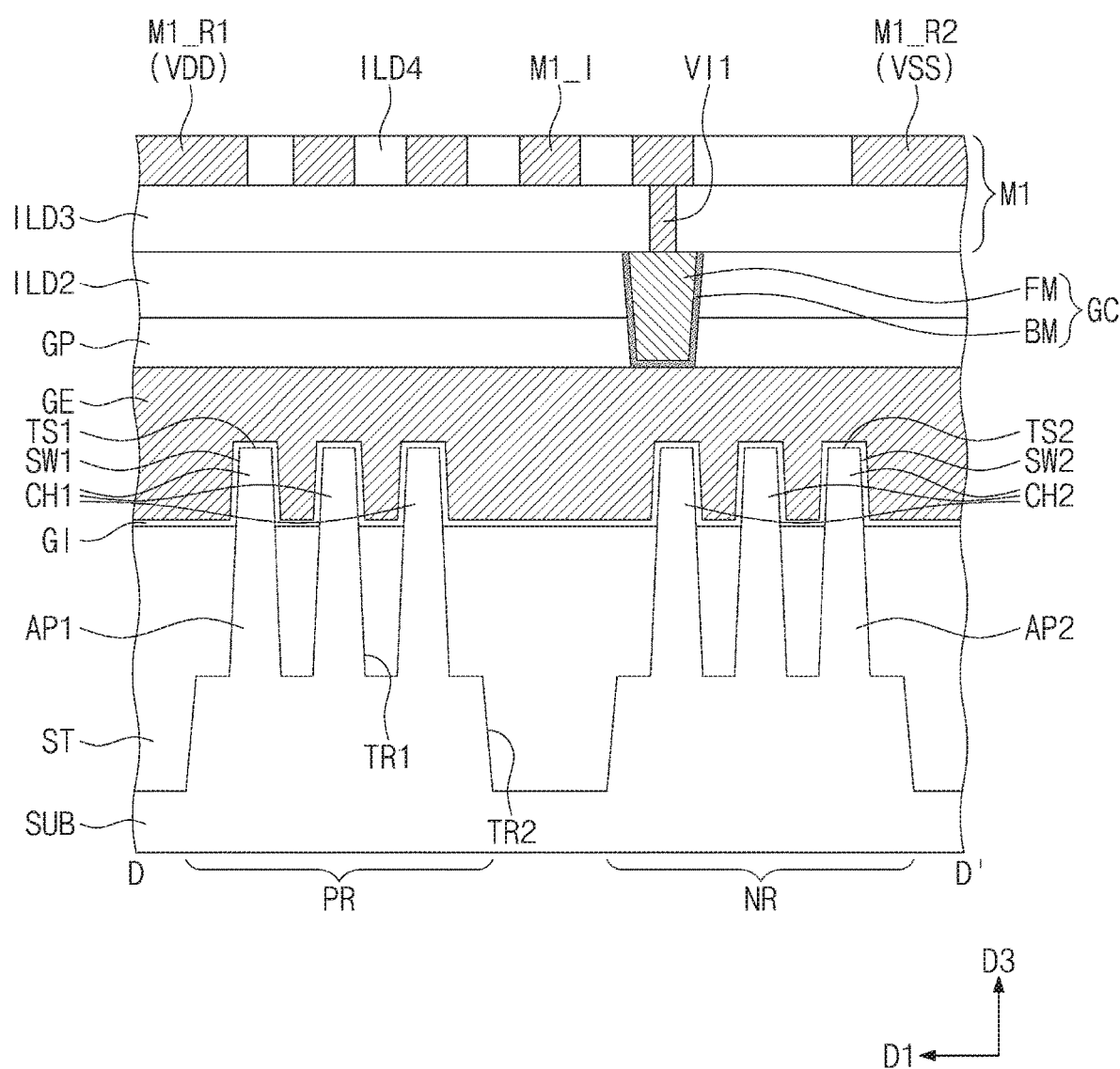

FIGS. 16 and 18 are plan views illustrating a method of fabricating a semiconductor device according to an embodiment of the present inventive concept. FIGS. 17A, 17B, 17C, and 17D are cross-sectional views, which are respectively taken along lines A-A', B-B', C-C', and D-D' of FIG. 16. FIGS. 19A, 19B, 19C, and 19D are cross-sectional views, which are respectively taken along lines A-A', B-B', C-C', and D-D' of FIG. 18.

Referring to FIGS. 16 and 17A to 17D, a logic cell LC may be provided on the substrate SUB. Logic transistors constituting a logic circuit may be formed on the logic cell LC.

The substrate SUB may include a first active region PR and a second active region NR. In an embodiment of the present inventive concept, the first active region PR may be a p-channel metal oxide semiconductor field effect transistor (PMOSFET) region, and the second active region NR may be an n-channel metal oxide semiconductor field effect transistor (NMOSFET) region. The substrate SUB may be a semiconductor substrate, which is made of silicon (Si), germanium (Ge), or silicon-germanium (SiGe), or a substrate, which is made of a compound semiconductor material. As an example, the substrate SUB may be a silicon (Si) wafer. Alternatively, the substrate SUB may include, but is not limited to, SOI (silicon-on-insulator), SGOI (silicon germanium on insulator), indium antimonide (InSb), lead tellurium (PbTe) compounds, indium arsenide (InAs), indium phosphide (InP), gallium arsenide (GaAs), gallium phosphide (GaP), or gallium antimonide (GaSb). Also, the substrate SUB may include one or more semiconductor layers or structures and may include active or operable portions of semiconductor devices.

A second trench TR2 may be formed in an upper portion of the substrate SUB to define the first active region PR and the second active region NR. The second trench TR2 may be located between the first and second active regions PR and NR. The first and second active regions PR and NR may be spaced apart from each other, in the first direction D1, with the second trench TR2 interposed therebetween. Each of the first and second active regions PR and NR may extend in the second direction D2 that is different from (e.g., perpendicular to) the first direction D1.

First active patterns AP1 and second active patterns AP2 may be formed on the first active region PR and the second active region NR, respectively. The first and second active patterns AP1 and AP2 may be arranged in the first direction D1, and may extend in the second direction D2 to be parallel to each other. Each of the first and second active patterns AP1 and AP2 may be a vertically-protruding portion of the substrate SUB. A first trench TR1 may be formed between adjacent ones of the first active patterns AP1 and between adjacent ones of the second active patterns AP2 to respectively define the first active patterns AP1 and the second active patterns AP2. The first trench TR1 may be shallower than the second trench TR2.

A device isolation layer ST may be formed to fill the first and second trenches TR1 and TR2. The device isolation layer ST may include a silicon oxide ($SiO_2$) layer. Upper portions of the first and second active patterns AP1 and AP2 may protrude vertically above the device isolation layer ST (e.g., see FIG. 17D). Each of the upper portions of the first and second active patterns AP1 and AP2 may be a fin-shaped pattern. The device isolation layer ST may not cover the upper portions of the first and second active patterns AP1 and AP2, and may cover lower side surfaces of the first and second active patterns AP1 and AP2. In an embodiment of the present inventive concept, a liner insulating layer may be provided between the device isolation layer ST and the first and second active patterns AP1 and AP2.

First source/drain regions SD1 may be formed in upper portions of the first active patterns AP1. The first source/drain regions SD1 may be impurity regions of a first conductivity type (e.g., p-type). A first channel region CH1 may be interposed between a pair of the first source/drain regions SD1, and may connect the pair of first source/drain regions SD1 to each other. Second source/drain regions SD2 may be formed in upper portions of the second active patterns AP2. The second source/drain regions SD2 may be impurity regions of a second conductivity type (e.g., n-type). A second channel region CH2 may be interposed between a pair of the second source/drain regions SD2, and may connect the pair of second source/drain regions SD2 to each other.

The first and second source/drain regions SD1 and SD2 may be formed by a selective epitaxial growth (SEG) process. That is, the first and second source/drain regions SD1 and SD2 may be epitaxial patterns.

The first source/drain regions SD1 may be formed of or include a semiconductor material (e.g., SiGe) whose lattice constant is larger than a lattice constant of the semiconductor material of the substrate SUB. In this case, the first source/drain regions SD1 may exert a compressive stress on the first channel regions CH1. For example, silicon-germanium (SiGe) in the PMOSFET source and drain regions (e.g., the first source/drain regions SD1) causes uniaxial compressive strain in the channels (e.g., the first channel regions CH1), thereby increasing hole mobility. As an example, the second source/drain regions SD2 may be formed of or include the same semiconductor material (e.g., Si) as the substrate SUB. In an embodiment of the present inventive concept, the second source/drain regions SD2 may be formed of or include single-crystalline silicon (sc-Si). Alternatively, the second source/drain patterns SD2 may include silicon carbide (SiC).

Gate electrodes GE may be formed to cross the first and second active patterns AP1 and AP2 and to extend in the first direction D1, and may be arranged at a constant pitch in the second direction D2. The gate electrodes GE may be vertically overlapped with the first and second channel regions CH1 and CH2. Each of the gate electrodes GE may be provided to face top and opposite side surfaces of each of the first and second channel regions CH1 and CH2.

Referring back to FIG. 17D, the gate electrode GE may be formed on a first top surface TS1 of the first channel region CH1 and at least one first side surface SW1 of the first channel region CH1. The gate electrode GE may be formed on a second top surface TS2 of the second channel region CH2 and at least one second side surface SW2 of the second channel region CH2. In other words, the transistor according to the present embodiment may be a three-dimensional fin field-effect transistor (e.g., FinFET), in which the gate electrode GE is provided to surround the channel regions CH1 and CH2 three-dimensionally.

Referring back to FIGS. 16 and 17A to 17D, a pair of gate spacers GS may be formed on opposite side surfaces of each of the gate electrodes GE. The gate spacers GS may extend in the first direction D1 along the gate electrodes GE. The gate spacers GS may be used to electrically separate the gate electrodes GE from active contacts AC, which will be described below. Top surfaces of the gate spacers GS may be higher than top surfaces of the gate electrodes GE. The top surfaces of the gate spacers GS may be coplanar with a top surface of a first interlayer insulating layer ILD1, which will be described below. The gate spacers GS may be formed of or include at least one of silicon carbonitride (SiCN), silicon carbon oxynitride (SiCON), or silicon nitride ($Si_3N_4$). As another example, the gate spacers GS may include a multi-layer containing at least two of silicon carbonitride (SiCN), silicon carbon oxynitride (SiCON), or silicon nitride ($Si_3N_4$).

A gate capping pattern GP may be formed on each of the gate electrodes GE. The gate capping pattern GP may extend in the first direction D1 along the gate electrode GE. The gate capping pattern GP may be formed of or include a material having an etch selectivity with respect to first and second interlayer insulating layers ILD1 and ILD2, which will be described below. For example, the gate capping patterns GP may be formed of or include at least one of silicon oxynitride (SiON), silicon carbonitride (SiCN), silicon carbon oxynitride (SiCON), or silicon nitride ($Si_3N_4$).

A gate insulating layer GI may be formed between the gate electrode GE and the first active pattern AP1 and between the gate electrode GE and the second active pattern AP2. The gate insulating layer GI may extend along a bottom surface of the gate electrode GE thereon. As an example, the gate insulating layer GI may cover the first top surface TS1 and the first side surfaces SW1 of the first channel region CH1. The gate insulating layer GI may cover the second top surface TS2 and the second side surfaces SW2 of the second channel region CH2. The gate insulating layer GI may cover a top surface of the device isolation layer ST below the gate electrode GE (e.g., see FIG. 17D).

In an embodiment of the present inventive concept, the gate insulating layer GI may be formed of or include a high-k dielectric material whose dielectric constant is higher than that of a silicon oxide ($SiO_2$) layer. As an example, the high-k dielectric material may include at least one of, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), lithium oxide ($Li_2O$), aluminum oxide ($Al_2O_3$), lead scandium tantalum oxide ($Pb(Sc,Ta)O_3$), or lead zinc niobate [$Pb(Zn_{1/3}Nb_{2/3})O_3$].

The gate electrode GE may include a first metal pattern and a second metal pattern formed on the first metal pattern. The first metal pattern may be provided on the gate insulating layer GI and near the first and second channel regions CH1 and CH2. The first metal pattern may include a work-function metal, which can be used to adjust a threshold voltage of the transistor. By adjusting a thickness and composition of the first metal pattern, a transistor having a desired threshold voltage may be obtained.

The first metal pattern may include a metal nitride layer. For example, the first metal pattern may be formed of or include nitrogen (N) and at least one metallic material, which is selected from a group including, for example, titanium (Ti), tantalum (Ta), aluminum (Al), tungsten (W) and molybdenum (Mo). In an embodiment of the present inventive concept, the first metal pattern may further include carbon (C). In an example embodiment of the present inventive concept, the first metal pattern may control a work function, and may include one or more selected from, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), titanium aluminum carbonitride (TiAlCN), titanium aluminum carbide (TiAlC), titanium carbide (TiC), tantalum carbonitride (TaCN), niobium nitride (NbN), niobium carbide (NbC), molybdenum nitride (MoN), molybdenum carbide (MoC), tungsten carbide (WC), and a combination thereof. The first metal pattern may include a plurality of stacked work-function metal layers.

The second metal pattern may be formed of or include a metallic material whose resistance is lower than the first metal pattern. For example, the second metal pattern may include at least one metallic material, which is selected from a group including, for example, tungsten (W), aluminum (Al), titanium (Ti), tantalum (Ta), ruthenium (Ru), titanium aluminum (TiAl), copper (Cu), cobalt (Co), nickel (Ni), platinum (Pt), nickel platinum (NiPt), niobium (Nb), molybdenum (Mo), rhodium (Rh), palladium (Pd), iridium (Ir), osmium (Os), silver (Ag), gold (Au), zinc (Zn), vanadium (V), and a combination thereof.

The first interlayer insulating layer ILD1 may be formed on the substrate SUB. The first interlayer insulating layer ILD1 may be formed to cover the gate spacers GS and the first and second source/drain regions SD1 and SD2. A top surface of the first interlayered insulating layer ILD1 may be substantially coplanar with top surfaces of the gate capping patterns GP and the top surfaces of the gate spacers GS. The second interlayer insulating layer ILD2 may be formed on the first interlayer insulating layer ILD1 to cover the gate capping patterns GP. In an embodiment of the present inventive concept, the first and second interlayer insulating layers ILD1 and ILD2 may be formed of or include silicon oxide ($SiO_2$).

A pair of division structures DB, which are opposite to each other in the second direction D2, may be formed at both sides of the logic cell LC. The division structure DB may extend in the first direction D1 and may be parallel to the gate electrodes GE. The division structure DB may be provided to penetrate the first and second interlayer insulating layers ILD1 and ILD2 and may extend into the first and second active patterns AP1 and AP2. The division structure DB may be provided to penetrate an upper portion of each of the first and second active patterns AP1 and AP2. The division structure DB may separate the first and second active regions PR and NR of the logic cell LC from the active region of a neighboring logic cell.

Active contacts AC may be formed to penetrate the first and second interlayer insulating layers ILD1 and ILD2 and to be electrically and respectively connected to the first and second source/drain regions SD1 and SD2. Each of the active contacts AC may be provided between a pair of the gate electrodes GE. A pair of the active contacts AC may be arranged in the second direction D2, and may be spaced apart from each other with the gate electrode GE interposed therebetween.

The active contact AC may be a self-aligned contact. For example, the active contact AC may be formed by a self-alignment process using the gate capping pattern GP and the gate spacer GS. In an embodiment of the present inventive concept, the active contact AC may cover at least a portion of the side surface of the gate spacer GS. In an embodiment of the present inventive concept, the active contact AC may be provided to cover a portion of the top surface of the gate capping pattern GP.

Silicide patterns SC may be formed between the active contact AC and the first source/drain region SD1 and between the active contact AC and the second source/drain region SD2 to provide reliable metal-semiconductor contact and reduce electrical resistance between the active contact AC and the first source/drain region SD1 and between the active contact AC and the second source/drain region SD2. The active contact AC may be electrically connected to the source/drain region SD1 or SD2 through the silicide pattern SC. The bottom surface of the active contact AC may be lower than the top surfaces of the first and second source/drain regions SD1 and SD2. However, the present inventive concept is not limited thereto. For example, in an example embodiment of the present inventive concept, the bottom surface of the active contact AC may be formed on a plane the same as those of the top surfaces of the first and second source/drain regions SD1 and SD2. The silicide pattern SC may be formed of or include at least one of metal silicide materials (e.g., titanium silicide ($TiSi_2$), tantalum silicide ($TaSi_2$), tungsten silicide ($WSi_2$), nickel silicide ($NiSi_2$), and cobalt silicide ($CoSi_2$)).

A gate contact GC may be formed to penetrate the second interlayer insulating layer ILD2 and the gate capping pattern GP and to be electrically connected to the gate electrode GE. In an embodiment of the present inventive concept, an upper insulating pattern UIP may be formed on each of the active contacts AC adjacent to the gate contact GC, as shown in FIG. 17B. In this case, the gate contact GC may be prevented from being in contact with the active contact AC adjacent thereto and thereby to prevent a short circuit issue from occurring between the gate and active contacts GC and AC.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum (Al), copper (Cu), tungsten (W), molybdenum (Mo), and cobalt (Co)). The barrier pattern BM may be provided to cover side and bottom surfaces of the conductive pattern FM. In an embodiment of the present inventive concept, the barrier pattern BM may include two layers such as a metal layer and a metal nitride layer. The metal layer may be formed of or include at least one of, for example, titanium (Ti), tantalum (Ta), tungsten (W), nickel (Ni), cobalt (Co), or platinum (Pt). The metal nitride layer may be formed of or include at least one of, For example, titanium nitride (TiN), tantalum nitride (TaN), tungsten nitride (WN), nickel nitride (NiN), cobalt nitride (CoN), or platinum nitride (PtN).

In an embodiment of the present inventive concept, the formation of the active and gate contacts AC and GC may include patterning the interlayer insulating layers ILD1 and ILD2 to form contact holes and filling the contact holes with the barrier pattern BM and the conductive pattern FM. The patterning process for forming the contact holes may be performed using the photolithography process previously described with reference to FIGS. 14 and 15. A photomask, which is used to form the active and gate contacts AC and GC (i.e., the contact holes), may be manufactured through the data preparation step S30 previously described with reference to FIGS. 4 to 13. In other words, the photomask, which is used to form the active and gate contacts AC and GC, may be manufactured through the curvilinear OPC step S31 and the MRC step S32 described with reference to FIGS. 4 to 13.

Referring to FIGS. 18 and 19A to 19D, a third interlayer insulating layer ILD3 may be formed on the second interlayer insulating layer ILD2. First vias VI1 may be formed in the third interlayer insulating layer ILD3. A fourth interlayer insulating layer ILD4 may be formed on the third interlayer insulating layer ILD3. Interconnection lines M1_R1, M1_R2, and M1_I may be formed in the fourth interlayer insulating layer ILD4. The interconnection lines M1_R1, M1_R2, and M1_I may include a first power line M1_R1, a second power line M1_R2, and lower interconnection lines M1_I.

Referring back to FIG. 18, each of the first and second power lines M1_R1 and M1_R2 may extend in the second direction D2 to cross the logic cell LC. In an embodiment of the present inventive concept, the lower interconnection lines M1_I may be disposed between the first and second lower power lines M1_R1 and M1_R2. In an embodiment of the present inventive concept, a drain voltage VDD and a source voltage VSS may be applied to the first and second lower power lines M1_R1 and M1_R2, respectively. The lower interconnection lines M1_I may be line- or bar-shaped patterns extending in the second direction D2.

The interconnection lines M1_R1, M1_R2, and M1_I and the first vias VI1 thereunder may constitute a first metal layer M1. In an embodiment of the present inventive concept, the interconnection lines M1_R1, M1_R2, and M1_I and the first vias VI1 thereunder may be formed of or include at least one of metallic materials (e.g., aluminum (Al), copper (Cu), tungsten (W), molybdenum (Mo), and cobalt (Co)). The first via VI1 may be interposed between the interconnection line and the active or gate contact AC or GC to electrically connect them to each other. In an embodiment of the present inventive concept, additional metal layers may be further formed on the first metal layer M1.

In an embodiment of the present inventive concept, the photolithography process previously described with reference to FIGS. 14 and 15 may be performed as a part of a patterning process to form the interconnection lines M1_R1, M1_R2, and MU. For example, to form the interconnection lines M1_R1, M1_R2, and MU, transistors may be formed on the substrate SUB, the fourth interlayer insulating layer ILD4 may be formed on the transistors, and the interconnection lines M1_R1, M1_R2, and M1_I may be formed in the fourth interlayer insulating layer ILD4. The photoresist pattern PRP may define a mask pattern for forming the interconnection lines M1_R1, M1_R2, and M1_I during the patterning process. A photomask, which is used to form the interconnection lines M1_R1, M1_R2, and MU, may be manufactured through the data preparation step S30 previously described with reference to FIGS. 4 to 13. In other words, the photomask, which is used to form the interconnection lines M1_R1, M1_R2, and MU, may be manufactured through the curvilinear OPC step S31 and the MRC step S32 described with reference to FIGS. 4 to 13.

In a data preparation step according to an embodiment of the present inventive concept, a curvilinear OPC may be used to provide highly accurate mask data. In the data preparation step according to an embodiment of the present inventive concept, by using a width skeleton and a space skeleton for a curvilinear correction pattern, a mask rule check may be executed in an efficient and fast manner. Accordingly, the highly accurate mask data may be generated quickly.

While example embodiments of the present inventive concept have been particularly shown and described, it will be understood by one of ordinary skill in the art that variations in form and detail may be made therein without departing from the spirit and scope of the present inventive concept as defined in the appended claims.

What is claimed is:

1. A method of fabricating a semiconductor device, comprising:
   performing an optical proximity correction (OPC) step on a layout to generate a correction pattern, the correction pattern having a curvilinear shape;
   performing a mask rule check (MRC) step on the correction pattern to generate mask data; and
   forming a photoresist pattern on a substrate using a photomask, which is manufactured based on the mask data,
   wherein the MRC step comprises:
   generating a width skeleton in the correction pattern;

generating a width contour, which satisfies a specification of a mask rule for a linewidth, from the width skeleton; and adding the correction pattern and the width contour to generate an adjusting pattern.

2. The method of claim 1, wherein a minimum linewidth of the adjusting pattern satisfies the specification of the mask rule for the linewidth.

3. The method of claim 2, wherein the adjusting pattern comprises a first side and a second side, which are opposite to each other, a space between the first and second sides corresponds to the minimum linewidth, and the first and second sides each has a linear shape.

4. The method of claim 1, wherein the OPC step comprises:

generating a target pattern from a design pattern of the layout; and generating a plurality of points that allow an OPC simulation image to correspond to the target pattern, wherein the points are connected to define the curvilinear shape of the correction pattern.

5. The method of claim 4, wherein the generating of the width skeleton is performed using position information on the points of the correction pattern.

6. The method of claim 1, wherein the correction pattern comprises a first correction pattern and a second correction pattern, which are adjacent to each other, and the MRC step further comprises:

generating a space skeleton between the first correction pattern and the second correction pattern;

generating a space contour, which satisfies a specification of the mask rule for a space between the first correction pattern and the second correction pattern, from the space skeleton; and generating a clean-up pattern by subtracting the space contour from the adjusting pattern.

7. The method of claim 6, wherein the clean-up pattern comprises a first clean-up pattern and a second clean-up pattern, which are respectively generated from the first and second correction patterns, and a minimum space between the first and second clean-up patterns satisfies the specification of the mask rule for the space between the first correction pattern and the second correction pattern.

8. The method of claim 7, wherein the first clean-up pattern and the second clean-up pattern comprise a first side and a second side, respectively, which face each other, a space between the first and second sides corresponds to the minimum space, and the first and second sides each has a linear shape.

9. The method of claim 1, wherein the adding of the correction pattern and the width contour comprises performing a Boolean "OR" operation.

10. The method of claim 1, further comprising:
forming transistors on the substrate;
forming an interlayer insulating layer on the transistors; and
forming interconnection lines in the interlayer insulating layer,
wherein the photoresist pattern defines a mask for forming the interconnection lines.

11. A method of fabricating a semiconductor device, comprising:

performing an optical proximity correction (OPC) step on a layout to generate a first correction pattern and a second correction pattern, which are adjacent to each other, and each of which has a curvilinear shape;

performing a mask rule check (MRC) step on the first and second correction patterns to generate mask data; and forming a photoresist pattern on a substrate using a photomask, which is manufactured based on the mask data, wherein the MRC step comprises:

generating a space skeleton between the first and second correction patterns;

generating a space contour, which satisfies a specification of a mask rule for a space between the first and second correction patterns, from the space skeleton; and subtracting the space contour from the first and second correction patterns to generate a first clean-up pattern and a second clean-up pattern, respectively.

12. The method of claim 11, wherein the OPC step comprises:

generating a first target pattern and a second target pattern from a first design pattern and a second design pattern of the layout, respectively; and generating first points and second points that allow first and second OPC simulation images to correspond to the first and second target patterns, respectively, wherein the first points are connected to define the curvilinear shape of the first correction pattern, and the second points are connected to define the curvilinear shape of the second correction pattern.

13. The method of claim 12, wherein the generating of the space skeleton is performed using position information on the first points of the first correction pattern and the second points of the second correction pattern.

14. The method of claim 11, wherein the MRC step further comprises:

generating a first width skeleton and a second width skeleton in the first and second correction patterns, respectively;

generating a first width contour and a second width contour, which satisfy a specification of the mask rule for a linewidth, from the first and second width skeletons, respectively;

adding the first correction pattern and the first width contour; and adding the second correction pattern and the second width contour.

15. The method of claim 11, wherein a minimum space between the first and second clean-up patterns satisfies the specification of the mask rule for the space between the first and second correction patterns.

16. A method of fabricating a semiconductor device, comprising:

performing an optical proximity correction (OPC) step on a layout to generate a first correction pattern and a second correction pattern, which are adjacent to each other, and each of which has a curvilinear shape;

performing a mask rule check (MRC) step on the first and second correction patterns to generate mask data; and forming a photoresist pattern on a substrate using a photomask, which is manufactured based on the mask data, wherein the MRC step comprises:

generating a first width contour and a second width contour according to a mask rule, in the first and second correction patterns, respectively;

generating a space contour according to the mask rule, between the first and second correction patterns; and performing a Boolean operation on the first and second correction patterns based on the first and second width contours and the space contour to generate a first clean-up pattern and a second clean-up pattern, respectively.

17. The method of claim 16, wherein the performing of the Boolean operation on the first and second correction patterns comprises:
adding the first and second width contours to the first and second correction patterns, respectively, to generate a first adjusting pattern and a second adjusting pattern, respectively; and
subtracting the space contour from the first and second adjusting patterns to generate the first and second clean-up patterns, respectively.

18. The method of claim 16, wherein the first clean-up pattern comprises a first side and a second side, which are opposite to each other,
a space between the first and second sides corresponds to a minimum linewidth according to the mask rule, and
the first and second sides each has a linear shape.

19. The method of claim 18, wherein the first clean-up pattern further comprises a third side, and the second clean-up pattern comprises a fourth side facing the third side,
a space between the third and fourth sides corresponds to a minimum space according to the mask rule, and
the third side and the fourth side each has a linear shape.

20. The method of claim 16, wherein the first and second clean-up patterns are a result obtained by removing portions that violate the mask rule from the first and second correction patterns.

\* \* \* \* \*